United States Patent [19]

Keeley et al.

[11] Patent Number: 4,667,288
[45] Date of Patent: May 19, 1987

[54] ENABLE/DISABLE CONTROL CHECKING APPARATUS

[75] Inventors: James W. Keeley, Hudson; Robert V. Ledoux, Litchfield, both of N.H.; Virendra S. Negi, Pepperell, Mass.

[73] Assignee: Honeywell Information Systems Inc., Waltham, Mass.

[21] Appl. No.: 509,898

[22] Filed: Jun. 30, 1983

[51] Int. Cl.$^4$ .............................................. G06F 11/22
[52] U.S. Cl. ........................................ 364/200; 371/10
[58] Field of Search ... 364/200 MS File, 900 MS File; 371/16, 21, 49, 10, 11

[56] References Cited

U.S. PATENT DOCUMENTS

| | | | |
|---|---|---|---|
| 4,077,059 | 2/1978 | Cordi et al. | 364/200 |
| 4,190,885 | 2/1980 | Joyce et al. | 364/200 |
| 4,392,201 | 7/1983 | Brown et al. | 364/200 |
| 4,394,733 | 7/1983 | Swenson | 364/200 |
| 4,464,717 | 8/1984 | Keeley et al. | 364/200 |
| 4,493,027 | 1/1985 | Katz et al. | 364/200 |

OTHER PUBLICATIONS

C. L. Chen et al, *Error Migration Protection for Multiprocessor With Hierarchial Memory*, IBM Tech. Disclos. Bull., (vol. 20, No. 9), pp. 3579–3580.

E. J. Annunziata et al, *Cache Error Handling In a Store-In-Cache Design*, IBM Tech. Disclos. Bull., (vol. 20, No. 9), pp. 3585–3586.

E. J. Annunziata et al, *Cache Purge In Store-In-Cache System*, IBM Technical Disclosure Bulletin, (vol. 20, No. 9), p. 3587.

*Primary Examiner*—Archie E. Williams
*Assistant Examiner*—Lawrence E. Anderson
*Attorney, Agent, or Firm*—Faith F. Driscoll; John S. Solakian

[57] ABSTRACT

A multilevel set associative cache system whose directory and cache store are organized into levels of memory locations includes control apparatus which selectively degrades cache operation in response to error signals from directory error checking circuits to those levels detected to be free from errors. Test control apparatus which couples to the directory error checking apparatus operates to selectively enable and disable the directory error checking circuits in response to commands received from a central processing unit so as to enable the testing of the cache directory and other portions of the cache system using common test routines.

28 Claims, 11 Drawing Figures

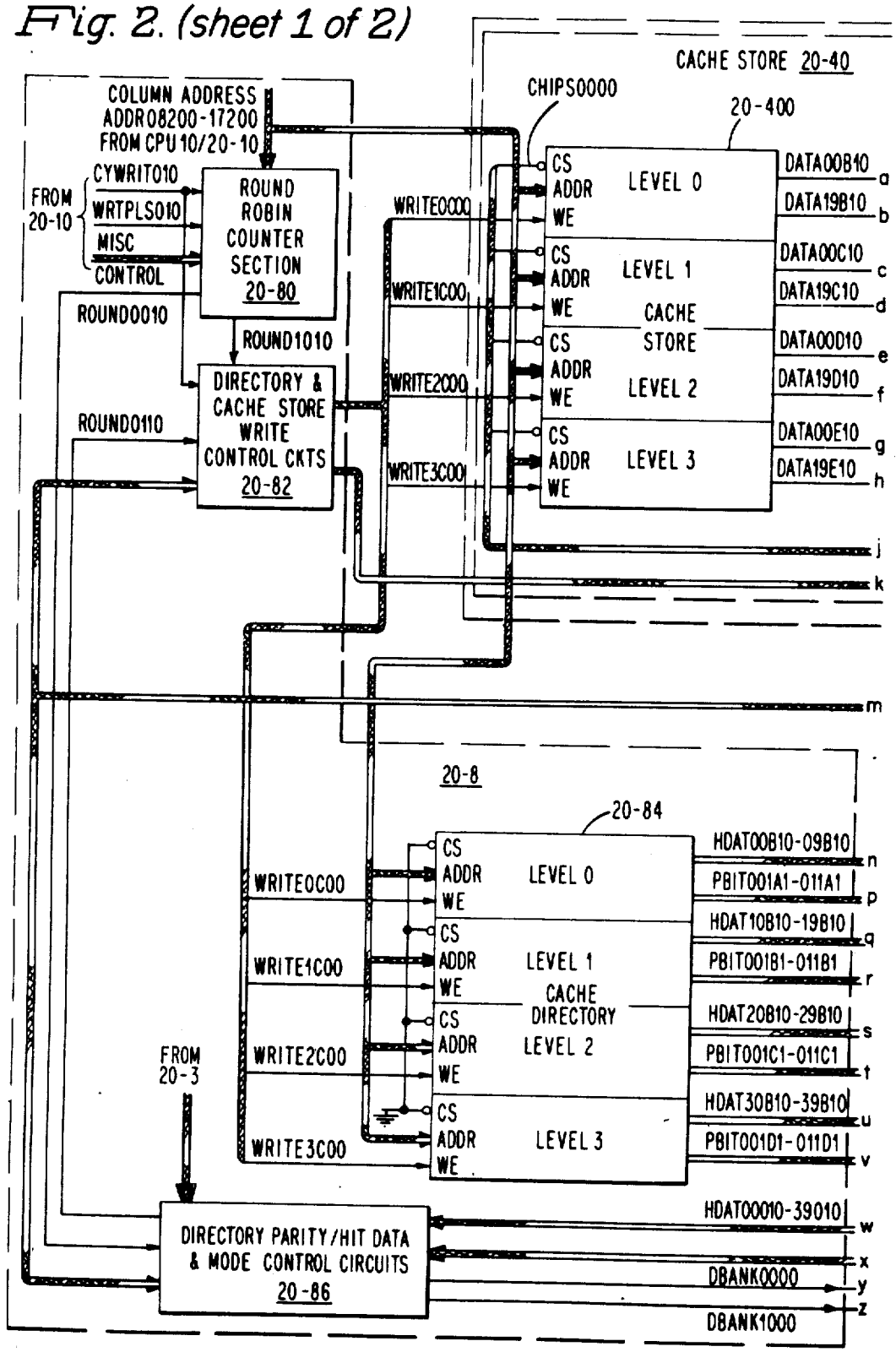
Fig. 2. (sheet 1 of 2)

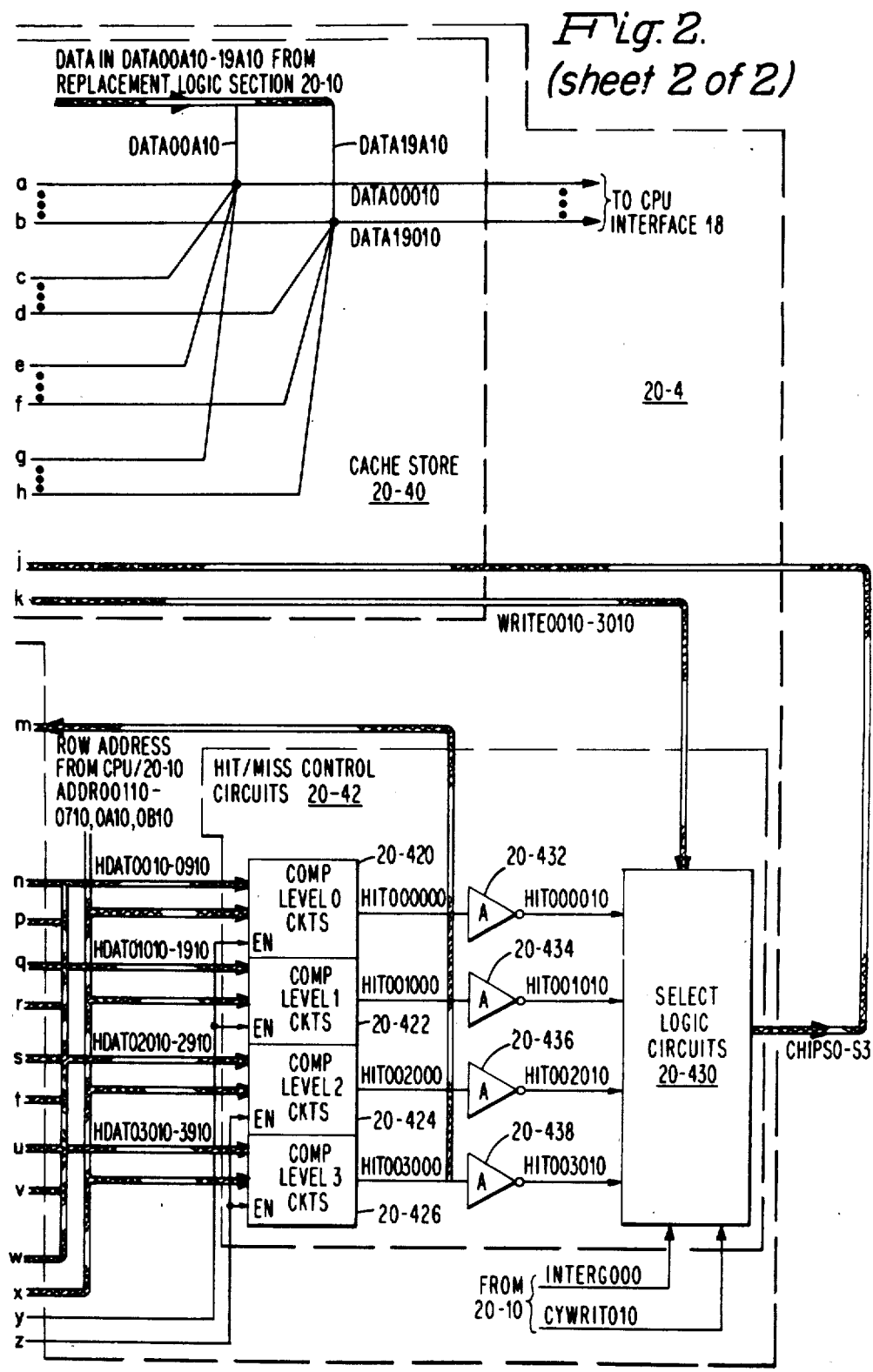
Fig. 2. (sheet 2 of 2)

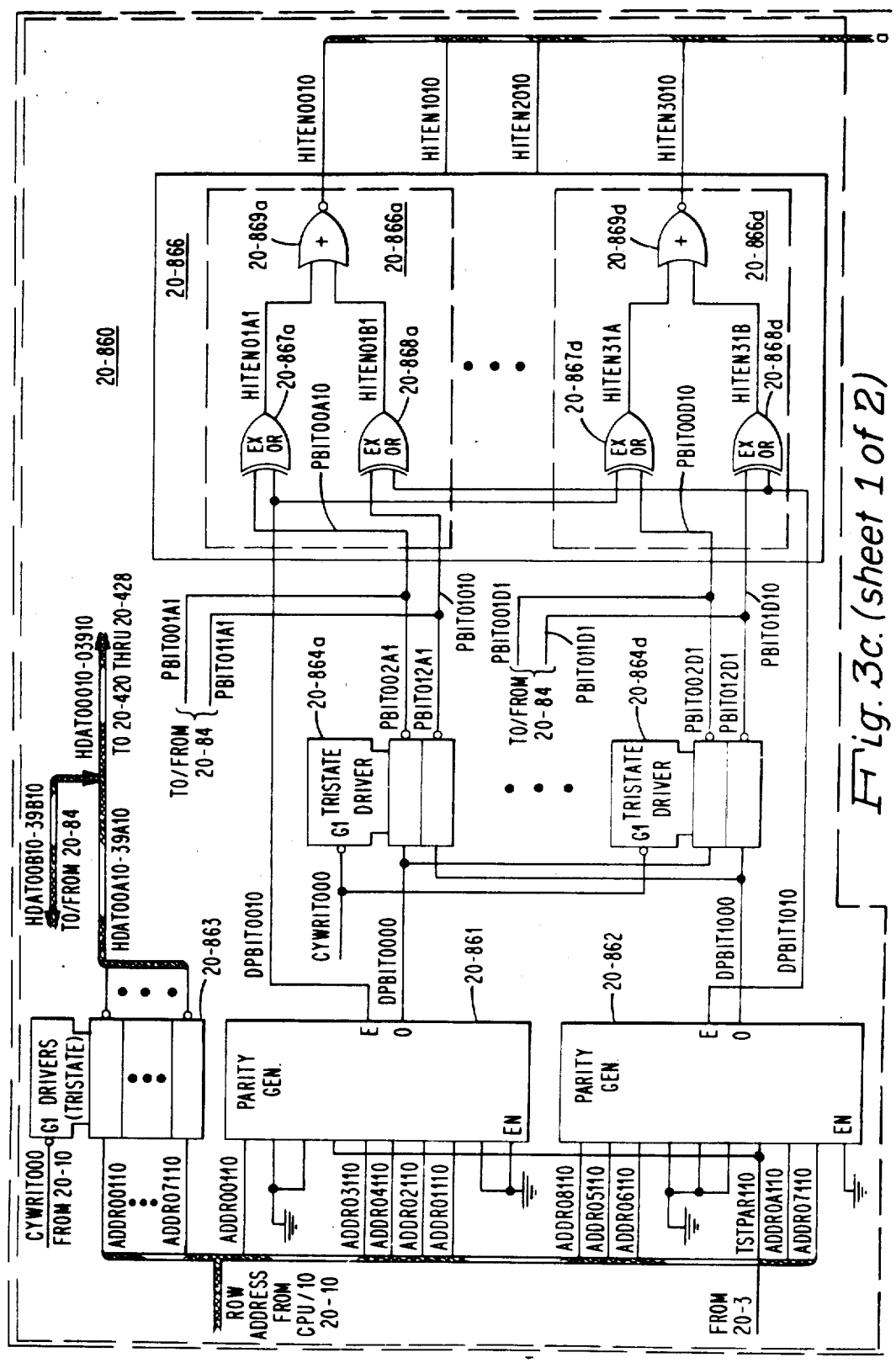
Fig. 3c. (sheet 1 of 2)

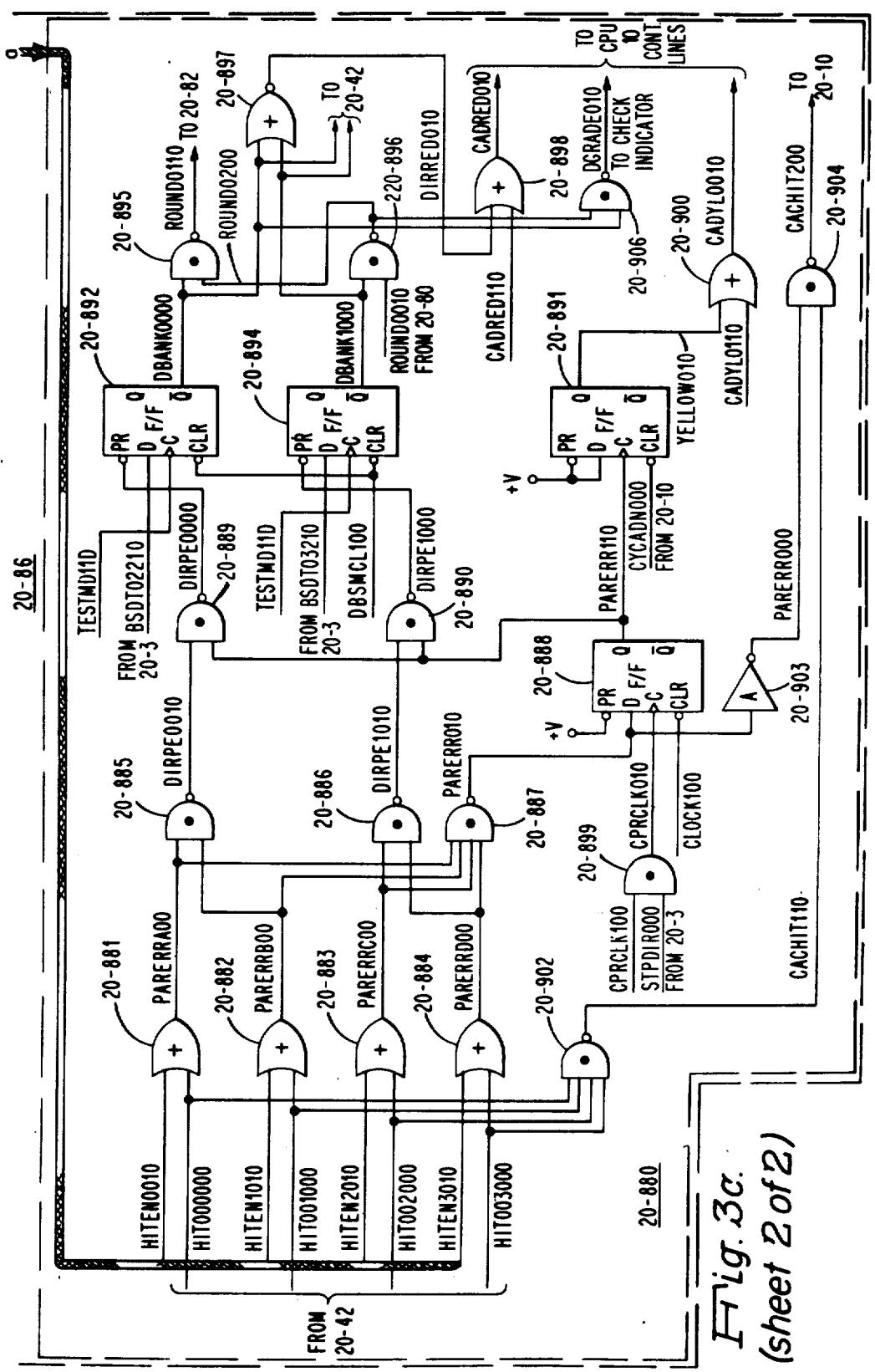
Fig. 3c. (sheet 2 of 2)

ENABLE/DISABLE CONTROL CHECKING APPARATUS

RELATED APPLICATIONS

1. "Multilevel Cache System with Graceful Degradation Capability", invented by James W. Keeley, Edwin P. Fisher and John L. Curley, Ser. No. 06/364,052, filed on Mar. 31, 1982 which issued as U.S. Pat. No. 4,464,717 on Aug. 7, 1984 and is assigned to the same assignee as named herein.

2. "Shared Interface Apparatus for Testing the Memory Sections of a Cache Unit", invented by James W. Keeley, Ser. No. 06/364,051, filed on Mar. 31, 1982 which issued as U.S. Pat. No. 4,575,792 on Mar. 11, 1986 and is assigned to the same assignee as named herein.

3. "Test Apparatus for Testing a Multilevel Cache System with Graceful Degradation Capability", invented by James W. Keeley, Robert V. Ledoux and Virendra S. Negi, Ser. No. 06/510,079, filed on June 30, 1983 and is assigned to the same assignee as named herein.

4. "Directory Test Error Mode Control Apparatus", invented by James W. Keeley, Robert V. Ledoux and Virendra S. Negi, Ser. No. 06/509,825, filed on June 30, 1983 which issued as U.S. Pat. No. 4,562,536 on Dec. 31, 1985 and assigned to the same assignee as named herein.

BACKGROUND OF THE INVENTION

1. Field of Use

The present invention relates to the testing of data processing systems and more particularly to the testing of cache systems.

2. Prior Art

It is well known in the art to provide cache units between a central processing unit (CPU) and a main store to improve overall system performance. However, since the cache unit is normally invisible to the operating system software during normal operation, errors or faults occurring within the cache unit are not detectable by such software. That is, when the cache is unable to provide correct data in response to a CPU request, the cache unit fetches the data from main store. This results in decreased system performance.

In view of the above, it becomes difficult to diagnose whether or not the cache unit is operating properly. In the past elaborate software diagnostic routines were employed for testing cache operation which involved transferring information from main store to cache for comparison with such known information when read from cache.

In order to eliminate the need for such elaborate software, one system arrangement enables the cache unit to be placed in a test and verification mode of operation wherein hardware faults can be signalled to the CPU. This arrangement is described in U.S. Pat. No. 4,190,885, issued Feb. 26, 1980, and is assigned to the same assignee as named herein. In greater detail, this system employs test and verification apparatus which responds to certain commands which enable the cache system to signal when the data requested from cache is not stored in cache after the cache has been initialized. This enables the test and diagnostic apparatus to test the directory and associated logic circuits. In this type of system, the cache is bypassed upon the detection of fault conditions by the CPU.

To improve the reliability of such cache systems, the cache system of the first related patent application includes control apparatus which couples to round robin replacement apparatus which is used to identify the cache level into which information is to be written. The control apparatus combines error signals from error checking circuits with signals indicative of cache hits to produce invalid hit signals. These signals condition the replacement apparatus, in addition to other portions of the cache system, to degrade cache operation to those levels detected as being free from errors. While the cache arrangement improves system reliability and performance, it makes diagnosis of faults more difficult.

The second related patent application discloses a cache unit which includes test mode logic circuits for enabling the cache memory section without controller interference. While the arrangement permits direct testing of the cache memory, it does not enable testing of the controller cache sections. Also, since the arrangement has particular application in factory test environment, it cannot be easily adapted for use with standard test and verification procedures carried out under the control of the system's central processing unit.

Accordingly, it is a primary object of the present invention to provide testing apparatus which facilitates the detection of faults within a cache unit during test and verification operations.

It is a further object of the present invention to provide testing apparatus which facilitates the detection of faults within the controller portions of a cache unit.

It is still a further object of the present invention to provide apparatus for testing the control circuits of a multilevel cache unit which is automatically degradable.

SUMMARY OF THE INVENTION

The above objects and advantages are achieved in a preferred embodiment of the multilevel set associative cache system which includes the test control apparatus and method of the present invention. The cache system is positioned between a central processing unit (CPU) and main memory. The directory and cache stores are organized into a number of levels of memory locations which are automatically degradable.

That is, the directory store checking circuits, upon detecting errors in the directory store addresses during cache read and write cycles of operation, condition control circuits which degrade cache operation to those levels detected to be free from errors.

The test control apparatus couples to the directory store checking circuits to selectively disable and enable these circuits in response to predetermined commands received from the CPU. By disabling the directory store checking circuits, this prevents the automatic degradation of cache levels thereby enabling continued testing of the cache directory store when errors are detected. This enables the test software routines to diagnose the source of errors without interference.

Additionally, the cache system of the present invention includes circuits which in response to CPU commands containing predetermined function code values are operative to generate negative acknowledgement signals which enable the CPU to differentiate the cache system of the preferred embodiment from other types of cache systems. Thereafter, the CPU can condition the test control apparatus to disable the cache checking circuits. This permits the same test software routines to be utilized in testing the various portions of all cache systems. This simplifies the test software. Without this capability, different portions of the test software would have to be expanded to handle situations in which automatic degradation has occurred.

The novel features which are believed to be characteristic of the invention, both as to its organization and method of operation, together with further objects and advantages will be better understood from the following description when considered in connection with the accompanying drawings. It is to be expressly understood, however, that each of the drawings are given for the purpose of illustration and description only and are not intended as a definition of the limits of the present invention. dr

BRIEF DESCRIPTION OF THE DRAWINGS

FIG. 2 is a block diagram of the cache unit of FIG. 1.

FIG. 3c shows the diretory parity and mode control circuits of the cache unit of FIG. 1.

DESCRIPTION OF THE PREFERRED EMBODIMENT

Figure 1:
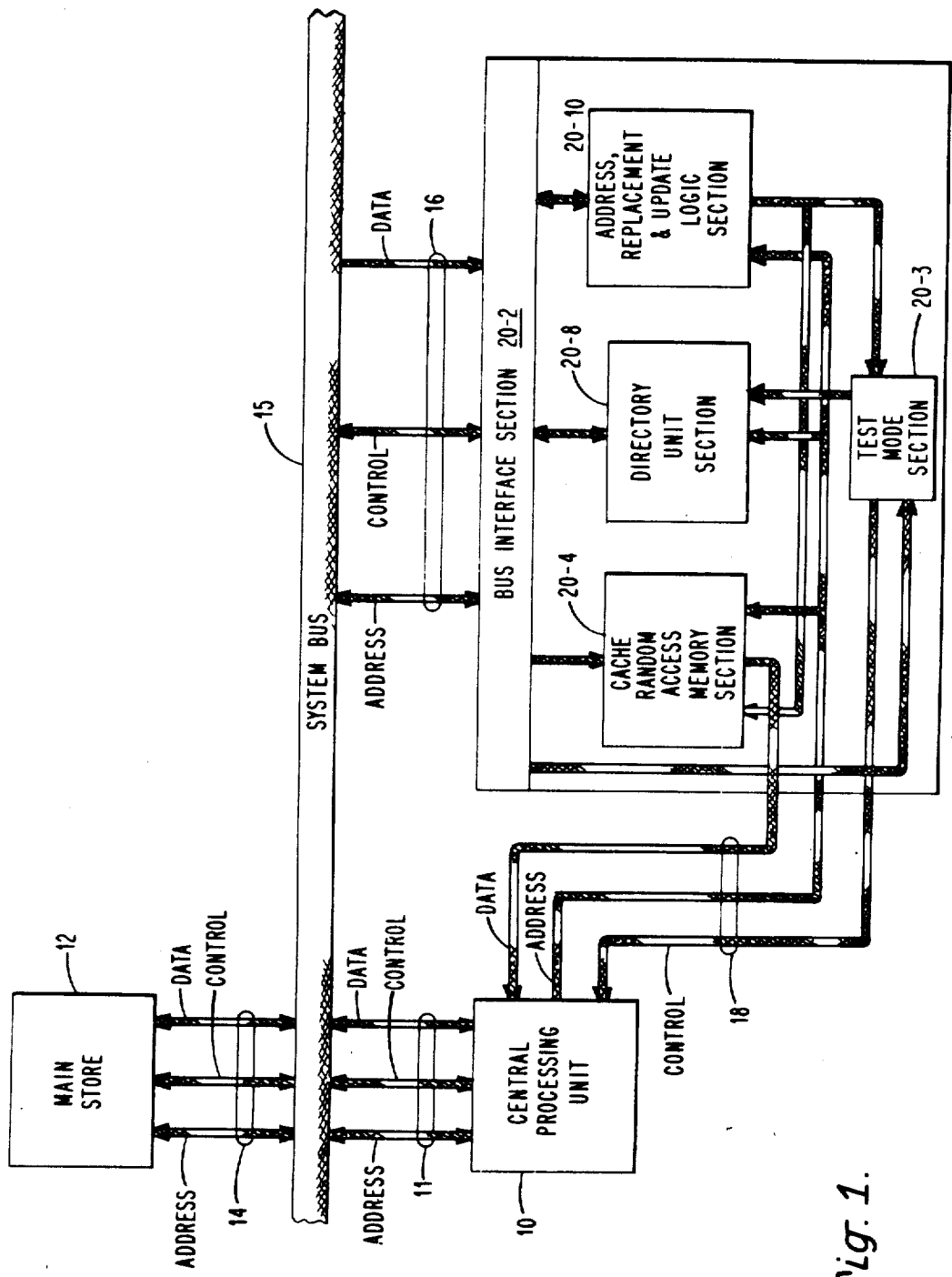
FIG. 1 is a block diagram of a minicomputer system including a cache unit which includes the test mode apparatus of the present invention.

Referring to FIG. 1, it is seen that the minicomputer system includes a central processing unit (CPU) 10, a main store 12 and a cache unit 20. As shown, the CPU 10, main store 12 and cache unit 20 couple to a system bus 15 via address control and data lines of bus interfaces 11, 14 and 16, respectively. Additionally, CPU 10 and cache unit 20 are interconnected through the address, control and data lines of a private interface 18.

For the purposes of the present invention, CPU 10 and main store 12 may be considered conventional in design. Main store 12 is a MOS memory which can include up to 1,048,576 words organized in 1,024 rows by 1.024 columns. For example, CPU 10 and main store 12 may take the form of the CPU and main memory described in U.S. Pat. No. 4,195,343 issued Mar. 25, 1980, assigned to the assignee named herein. Also, they may take the form of the units included in the Series 60 Level 6 Model 53 minicomputer manufactured by Honeywell Information Systems Inc.

The cache unit 20 provides high speed access to processor data and instructions which have been previously used or are expected to be used (e.g. prefetched). In general, CPU 10 requests data words and instructions via private interface 18. When the requested word is in cache, the cache unit 20 transfers the requested word over the interface 18. When the requested word is not stored in cache, cache unit 20 fetches the word from main store 12 and transfers it to CPU 10 via private interface 18.

The cache unit 20 of the preferred embodiment includes a bus interface section 20-2, a directory section 20-8, a cache random access memory (RAM) section 20-4 and a replacement logic section 20-10 and a test mode section 20-3. The bus interface section 20-2 includes the bus control circuits for enabling the cache unit 20 to access main store 12 through asynchronous system bus 15 for fetching data and instructions in response to requests from CPU 10. For further information regarding a number of these circuits and the operation of system bus 15, reference may be made to U.S. Pat. Nos. 3,993,981, 4,030,075 and 4,195,343.

The directory section 20-8 determines whether or not the CPU requested word resides in Section 20-4. To accomplish this, the directory section 20-8 as discussed herein includes a 4-level set associative memory. Also, it operates to generate invalid hit detection signals in response to error signals used for placing the cache unit 20 in a degraded mode of operation.

The cache RAM section 20-4 includes the high speed storage for CPU data and instructions. It has 4096 words of storage which are organized into four by 1,024 columns of storage. Accordingly, each column of main store 12 has four entries in cache section 20-4 associated therewith.

The replacement logic section 20-10 includes the circuits which control access to main store 12 for fetching data or instructions requested by CPU 10 which were not found in cache RAM section 20-4. Also, it includes logic circuits for storing information received from main store 12 in both the cache RAM section 20-4 and directory section 20-8 during replacement and update operations.

The test mode section 20-3 includes the circuits which, in response to commands from CPU 10, operate to condition other portions of cache unit 20 to enable test and verification operations to be performed under the control of test software routines resident within section 20-4.

Cache RAM Section 20-4

FIG. 2 illustrates in block diagram form, the units which comprise sections 20-4 and 20-8. As seen from the Figure, section 20-4 includes the 4-level cache store 20-40 and hit/miss control circuits 20-42. Each level of store 20-40 includes six RAM chips, each chip containing 1024 by 4-bit locations. As seen from FIG. 2, each RAM chip receives column address signals ADDR08200 through ADDR17200 from replacement logic section 20-10. These signals correspond to the least significant 10 address bits of the main store address received from CPU 10 (e.g. bits 10–19) Additionally, the six chips of each level receive corresponding one of the chip select signals CHIPS0000 through CHIPS3000 from the circuits of block 20-42. When any one of these signals is forced to a binary ZERO, all of the RAM chips of the designated level are enabled for operation.

The RAM levels may be considered conventional in design and may, for example, be constructed from 2149H MOS memory chips manufactured by Intel Corporation.

Lastly, the RAM chips of each level receive a corresponding one of the write enable signals WRITE0C00 through WRITE3C00 from directory section 20-8.

When any one of these signals is forced to a binary ZERO, all of the chips of the designated level are enabled for a write operation. The data to be written into the designated level is applied to a set of data in lines as signals DATA00A10 through DATA19A10 which are received from section 20-10. Also, data is read out from the chips of each level to a set of output lines as signals DATA00010 through DATA19010. The input and output data lines common to each level are connected in a wired OR arrangement as shown in FIG. 2.

As seen from FIG. 2, the hit/miss control circuits of block 20-42 include four comparator circuits 20-420 through 20-426. These circuits compare the row address signals ADDR0010 through ADDR0710, signals ADDR00A10 and ADDR00B10 from CPU 10 or replacement logic section 20-10 with the address signals read out from a corresponding one of the directory levels (i.e., signals HDAT00B10-09B10, HDAT10B10-19B10, HDAT20B10-29B10 and HDAT30B10-39B10). The row address corresponds to the most significant 10 bits of the main store address (i.e., bits 0-9).

Each of the comparator circuits 20-420 through 20-426 generates a corresponding one of the hit signals HIT000000 through HIT003000 indicative of the results of the comparison. The hit signals are applied as inputs to directory section 20-8 and to the select logic circuits of block 20-430. When there is a true or identical comparison, the comparator circuit forces a corresponding one of the hit signals to a binary ZERO.

The comparator circuits are conventional in design. For example, each comparator circuit may be constructed from 10 exclusive OR circuits connected to compare each pair of corresponding address bits and a NAND gate connected to receive the outputs of the exclusive OR circuits. Additionally, the NAND gate is connected to receive one of the pairs of signals DBANK0000 and DBANK1000 from directory section 20-8. As explained herein, the states of these signals establish whether or not cache unit 20 is being operated in a degraded mode of operation.

As seen from FIG. 2, signals HIT000000 through HIT003000 are inverted by inverter circuits 20-432 through 20-438 and the output signals HIT000010 through HIT003010 are applied as inputs to the logic circuits of block 20-430. These circuits operate to generate chip enable signals CHIPS0000 through CHIPS3000. These signals are generated in accordance with the following Boolean equations wherein the symbol + represents an OR operation and the symbol · represents an AND operation.

CHIPS0000=HIT000010·INTERG000+-WRITE0010·CYWRIT010
CHIPS1000=HIT001010·INTERG000+-WRITE1010·CYWRIT010
CHIPS2000=HIT002010·INTERG000+-WRITE2010·CYWRIT010
CHIPS3000=HIT003010·INTERG000+-WRITE3010·CYWRIT010.

The signals INTERG000 and CYWRIT010 are timing signals generated by the circuits of replacement logic section 20-10.

Signal INTERG000 is a binary ZERO when data is not being applied to bus interface 18 from cache store 20-40. Signal CYWRIT010 is forced to a binary ONE during each memory write cycle of operation. For further information regarding the operation of these signals, reference may be made to U.S. Pat. No. 4,195,343.

Directory Section 20-8

As seen from FIG. 2, section 20-8 includes the round robin counter circuits of block 20-80, the directory and cache store write control circuits of block 20-82, the four-level set associative directory 20-84 and the directory parity and mode control circuits of block 20-86. The round robin counter circuits of block 20-80 select the next column of cache store 20-400 whose information is to be replaced with new information. The round robin replacement technique employed replaces the least recently replaced location with new information.

Briefly, each cache column is managed independently in that the circuits of block 20-80 ascertain which of the four entries of the column is to be allocated a word from a corresponding main memory column. The allocation is carried out by employing a separate counter for each column whose contents point to the next word location in the cache column to be assigned or allocated. As each new word is stored in cache, the counter associated with the cache column is incremented by one in a wrap-around fashion so that the fifth in a series of new memory references to the same column replaces the information of first memory reference. Thus, the contents of a cache word location that is the least recently replaced in a column is replaced by information from a memory reference to a word in the corresponding memory column that is not already in cache.

Round Robin Counter Section 20-80

Figure 3A:
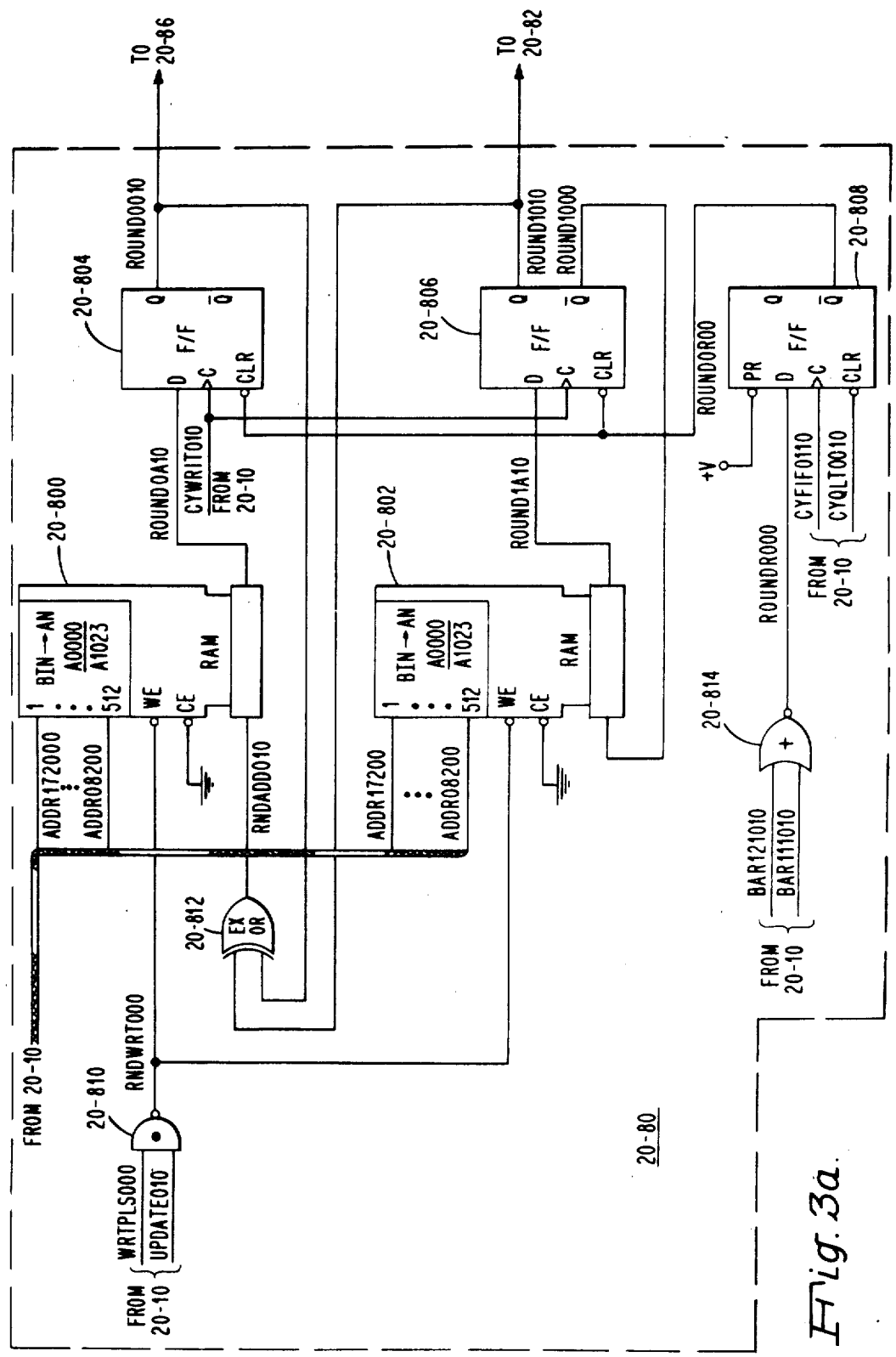
FIG. 3a shows the round robin counter circuits of the cache unit of FIG. 1.

As seen in FIG. 3a, the round robin counter circuits of block 20-80 include a pair of 1-bit×1024 RAM chips 20-800 and 20-802, a plurality of D-type flip-flops 20-804 through 20-808, a NAND gate 20-810, an exclusive OR gate 20-812 and a NOR gate 20-814 connected as shown. The chip enable terminals (CE) of RAM chips 20-800 and 20-802 connect to ground which enable the chips for a read or write cycle of operation. The RAM chips 20-800 and 20-802 in response to column address signals ADDR08200 through ADDR17200 applied to the chips' address input terminals by section 20-10 generate output signals ROUNDOA10 and ROUND1A10 which specify the cache column storing the least recently replaced information.

The write enable terminals (WE) of RAM chips 20-800 and 20-802 are enabled for a write cycle of operation as a function of signal RNDWRT000 from NAND gate 20-810. When write signal WRTPLS000 generated from delaying signal CYWRIT010 and signal UPDATE010 are both binary ONES, NAND gate 20-810 forces signal RNDWRT000 to a binary ZERO enabling RAM chips 20-800 and 20-802 for a write cycle of operation.

Write cycles of operation are generated during a quality logic test (QLT) mode of operation wherein the first 4096 data words stored in main store 12 are written into cache. During the QLT mode, signal CYQLT0010 is a binary ONE enabling flip-flop 20-808 to switch state as a function of signal ROUNDR000.

When both signals BAR012010 and BAR111010 are binary ZEROS, NOR gate 20-814 forces signal ROUNDR000 to a binary ONE. When cycle timing signal CYFIF0110 switched to a binary ONE, signal ROUNDR000 switches flip-flop 20-808 to a binary ONE. This in turn forces the binary ZERO output signal ROUNDOR00 to a binary ZERO.

Signal ROUNDOR00 when a binary ZERO generates a clear signal which holds flip-flops 20-804 and 20-806 in their binary ZERO states. The binary ZERO states of signals ROUND0010 and ROUND1010 cause exclusive OR gate 20-812 to force signal RNDADD010 to a binary ZERO. Accordingly, a binary ZERO is applied to the data input terminal of RAM chip 20-800. At the same time, since flip-flop 20-806 is in a binary ZERO state, signal ROUND1000 is a binary ONE. Therefore, a binary ONE is applied to the data input terminal of RAM chip 20-802.

During a first addressing sequence, signal CYWRIT010 is forced to a binary ONE during each of the 1024 write cycles which in turn forces write pulse enable signal WRTPLS000 to a binary ONE. Since signal UPDATE010 is a binary ONE during QLT mode, NAND gate 20-810 forces signal RNDWRT000 to a binary ZERO enabling both RAM chips 20-800 and 20-802 for a write cycle of operation. During the write cycle, a binary ZERO is written into a bit location of RAM chip 20-800 while a binary ONE is written into a bit location of RAM chip 20-802.

Binary ZEROS are successively written into the 1024 bit locations of RAM chip 20-800 corresponding to addresses 0000-1023 while binary ONES are successively written into the 1024 bit locations of RAM chip 20-802 having the same corresponding addresses. During the first addressing sequence, the binary ZERO outputs from flip-flops 20-804 and 20-806 are applied to other portions of the cache, enabling the cache and directory locations of level 0 to be written.

When the address 1024 hexidecimal "400" is reached signalling the end of the first sequence, signal BAR12010 is forced to a binary ONE. This causes NOR gate 20-814 to force signal ROUNDR000 to a binary ZERO. When cycle timing signal CYF1F0110 switches to a binary ONE, flip-flop 20-808 switches to a binary ZERO. At this time, flip-flops 20-804 and 20-806 are enabled for switching. Again, hexidecimal address "0000" is applied to RAM chips 20-800 and 20-802. Signal ROUNDOA10 read from RAM chip 20-800 is a binary ZERO while signal ROUND1A10 read from RAM chip 20-802 is a binary ONE. When signal CYWRIT010 switches to a binary ONE, flip-flop 20-806 switches to a binary ONE state. This causes exclusive OR circuit 20-812 to switched signal RNDADD010 to a binary ONE. Accordingly, a binary ONE signal is applied to the data input of RAM chip 20-800 while a binary ZERO signal is applied to the data input of RAM chip 20-802. Accordingly, a binary ONE is written into the first bit location of RAM chip 20-800 while a binary ZERO is written into the first bit location of RAM chip 20-802. The second address sequence continues with binary ONES being written into the 1024 bit locations of RAM chip 20-800 and binary ZEROS being written into the 1024 bit locations of RAM chip 20-802. During the second addressing sequence, the binary ZERO and binary ONE outputs from flip-flops 20-804 and 20-806 enable data words and row addresses to be written into the level 1 cache and directory locations, respectively.

During the third and fourth addressing sequences, data words and row addresses are written into second and third levels of cache store 20-400 and directory 20-84. For further information regarding the QLT mode of operation, reference may be made to U.S. Pat. No. 4,195,343.

Directory and Cache Write Control Circuits 20-82

Figure 3B:
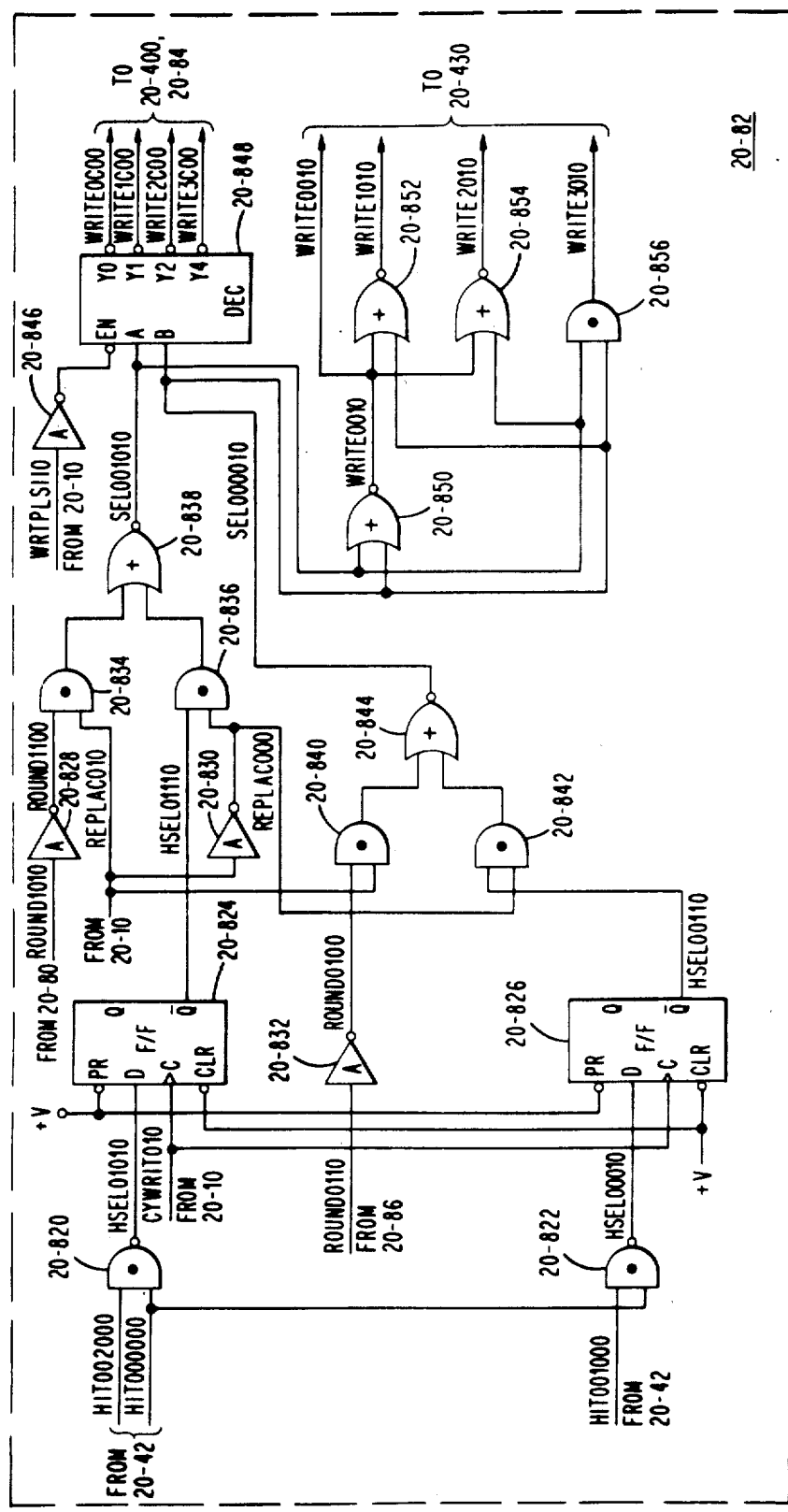
FIG. 3b shows the directory and cache write control circuits of the cache unit of FIG. 1.

The directory and cache store write control circuits of block 20-82 are shown in greater detail in FIG. 3b. These circuits in response to cache hit signals HIT001000 through HIT002000 from Section 20-4 and round robin signals ROUND0110 and ROUND1010 from sections 20-86 and 20-80 are operative to generate sets of write signals WRITE0C00 through WRITE3C00 and WRITE0010 through WRITE3010. The signals WRITE0C00 through WRITE3C00 are applied to cache store 20-400 and cache directory 20-84 for enabling data words and row addresses to be written into the specified cache and directory locations during both replacement and write cycles of operations.

In greater detail, the circuits of block 20-82 include a pair of NAND gates 20-820 and 20-822, a pair of D-type flip-flops 20-824 and 20-826, a plurality of inverter circuits 20-828, 20-830, 20-832 and 20-846, a plurality of AND gates 20-834, 20-836, 20-840, 20-842 and 20-856, a plurality of NOR gates 20-838, 20-844, 20-850 through 20-854 and a decoder circuit 20-848. The NAND gates 20-820 and 20-822 in response to signals HIT000000 through HIT002000 generate hit select signals HSEL01010 and HSEL00010, respectively, for setting D-type flip-flops 20-824 and 20-826. Two sets of AND/NOR gates 20-834, 20-836, 20-838 and 20-840, 20-842, 20-844 combine different ones of the round robin signals ROUND1010, ROUND0110, replacement signals REPLAC010 and REPLAC000 and hit select signals HSEL01110, HSEL00110 to generate select signals SEL001010 and SEL000010 as shown. The signals are decoded by decode circuit 20-848 and result in an appropriate one of the write signals WRITE0C00 through WRITE3C00 being forced to a binary ZERO state in response to write signal WRTPLS110. Also, signals SEL00010 and SEL001010 are selectively combined within NOR gates 20-850 through 20-854 and AND gate 20-856 for generating corresponding ones of the write signals WRITE0010 through WRITE3010.

Cache Directory 20-84

As seen from FIG. 2, each level of the 4-level directory includes three RAM chips, each chip containing 1024 by 4 bit locations. Each RAM chip receives column address signals ADDR08200 through 17200 from section 20-5. These signals correspond to the most significant 10 address bits of the main store request address (i.e., bits 0-9). All of the chips of the directory 20-84 are by grounding the chip select terminals (CS) of the chips as indicated in FIG. 2.

Additionally, the three chips of each level receive a corresponding one of the write enable signals WRITE0C00 through WRITE3C00 from section 20-82. When any one of these signals is forced to a binary ZERO, all of the chips of the designated level are enabled for a write operation.

During normal operation, the directory address data to be written into the designated level is inverted and applied via tristate driver circuits of block 20-86 to a corresponding one of sets of data in lines as one of the sets of signals HDAT00B10-HDAT09B10 through HDAT30B10-HDAT39B10 of the designated level. Additionally, as explained herein, parity generator circuits included within block 20-86 generate signals PBIT001A1, PBIT011A1 through PBIT001D1, PBIT011D1 which are the sets of parity bits for different five bit portions of the row address which are also written into the designated directory level.

Directory Parity and Mode Control Circuits 20-86

The directory parity and mode control circuits of block 20-86 are shown in greater detail in FIG. 3c These directory parity circuits include the parity generation circuits, address and parity driver circuits and comparator circuits of block 20-860. The mode control circuits include the hit comparator, mode control and the error indicator circuits of block 20-880.

As seen from FIG. 3c, block 20-860 includes a pair of parity generator circuits 20-861 and 20-862, each of which generates a parity bit for a different five bits of the row address portion (i.e., signals ADDR00110-ADDR08110, ADDR0A110) of the input memory address from Section 20-10. Additionally, each of the circuits 20-861 and 20-862 receive an additional signal TSTPAR110. This signal is selectively generated by test mode section 20-3 and causes incorrect parity bits to be generated for the different five row address bits.

The same row address is applied to the inverter tristate driver circuit of block 20-863. These circuits are enabled during a write operation by signal CYWRIT000 being forced to a binary ZERO. This causes the inverted row address to be applied at the driver output terminals as signals HDAT00A10 through HDAT39A10.

From there, they are applied to the data input/output terminals of the cache directory chips of each of the levels of directory 20-84. During each read operation, the driver circuits of block 20-863 are disabled enabling the cache directory row address read out from directory 20-84 to be applied as the four sets of signals HDAT00010-0810 through HDAT03010-3910 to comparator circuits 20-420 through 20-428. As mentioned, these signals are compared with the row address for determining the occurrence of a hit condition.

In a similar fashion, the generated odd parity signals DPBIT0000 and DPBIT1000 are applied to the inputs of inverting tristate driver circuits 20-864a through 20-864d. When enabled during a write operation, the inverted parity signals are applied to the input/output terminals of the cache directory chips of the directory levels of directory 20-84. By inverting the row address and associated parity bits therewith, it is possible to reduce the amount of logic circuits required to perform the desired comparison.

During a read operation, the driver circuits 20-864a through 20-864d are disabled and the four pairs of parity bit signals read out from directory 20-84 are applied to corresponding ones of the four comparator circuits 20-866a through 20-866d of block 20-866. The pairs of directory parity signals are compared with the parity signals DPBIT0010 and DPBIT1010 generated by circuits 20-861 and 20-862.

As seen from FIG. 3c, each of the comparator circuits 20-866a through 20-866d includes a pair of exclusive OR gates (e.g. 20-867a and 20-868a) whose outputs are combined within an output NOR gate (e.g. 20-869a). When the row address generated parity bits compare. bits read out from the corresponding directory level, then the output NOR gate forces a corresponding one of the hit enable signals HITEN0010 through HITEN3010 to a binary ONE state. This indicates that no directory parity error was detected. When a directory parity error is detected in a level, a corresponding one of the signals HITEN0010 through HITEN3010 is forced to a binary ZERO state.

The hit enable signals are applied as inputs to the circuits of block 20-880. These circuits include four OR gates 20-881 through 20-884 which combine the hit enable signals HITEN0010 through HITEN3010 with the hit signals HIT000000 through HIT003000 from Section 20-42 to generate hit invalid signals PARERRA00 through PARERRD00. When a hit condition is detected by the circuits of Section 20-42, a corresponding one of the signals HIT000000 through HIT003000 is forced to a binary ZERO state. When a directory parity error is detected by the comparator circuits 20-866, the hit enable signal for that level is forced to a binary ZERO. This in turn causes one of the OR gates 20-881 through 20-884 to force the appropriate hit invalid signal to a binary ZERO state.

All four of the hit invalid signals are combined within a NAND gate 20-887. This gate forces signal PARERR010 to a binary ONE in response to an invalid hit (i.e., when one of the signals PARERRA00 through PARERRD00 is a binary ZERO). The signal PARERR010 is selectively clocked into a D-type flip-flop 20-888 in response to signal CPRCLK010. Signal CPRCLK010 is generated by an AND gate 20-899, in response to signal CPRCLK100 from section 20-10 and a stop parity directory signal STPDIR000 from test mode section 20-3. The state of flip-flop 20-888 signals when the directory parity error condition is valid (i.e., occurs during a directory read cycle of operation).

Also, the invalid hit signals are combined within a pair of NAND gates 20-885 and 20-886, as shown. That is, the invalid hit signals for levels 0 and 1 are combined within NAND gate 20-885 while the invalid hit signals for levels 2 and 3 are combined within NAND gate 20-886. When NAND gate 20-885 forces signal DIRPE0010 to a binary ONE, this signals the detection of an invalid hit within levels 0 and 1. Similarly, when NAND gate 20-886 forces signal DIRPE1010 to a binary ONE, this signals the detection of an invalid hit within levels 2 and 3.

The directory hit signals DIRPE0010 and DIRPE1010 are combined with parity error valid signal PARERR110 within a further pair of NAND gates 20-889 and 20-890. When NAND gate 20-889 forces signal DIRPE0000 to a binary ZERO state, this signals that a valid error was detected as having occurred within directory level 0 or 1. Similarly, when NAND gate 20-890 forces signal DIRPE1000 to a binary ZERO state, this signals that a valid error was detected as having occurred within level 2 or 3.

The signals DIRPE0000 and DIRPE1000 respectively control the switching of a pair of D-type flip-flops 20-892 and 20-894. When either signal is switched to a binary ZERO, it causes a corresponding one of the flip-flops 20-892 and 20-894 to switch to a binary ONE state. Additionally, the clock input terminal of each of the flip-flops 20-892 and 20-894 is coupled to receive from test mode section 20-3, a clocking signal TESTMD1ID. The D input terminal of flip-flop 20-892 receives bus data signal BSDT02210 while the D input terminal of flip-flop 20-894 receives bus data signal BSDT03210. As explained herein, when clocking signal TESTMD1ID switches positive, each of the flip-flops 20-892 and 20-894 switches to the states specified by the states of data signals BSDT02210 and BSDT03210, respectively.

The output signals DBANK0000 and DBANK1000 from the flip-flops are used to control the counting sequence of the round robin circuits as well as the operation of other cache sections. For example, these signals are combined with the most significant bit signal ROUND0010 from round robin Section 20-80 within the series connected pair of NAND gates 20-895 and 20-896. The output signal ROUND0110 generated by the output gate 20-895 controls or establishes the state of the most significant bit signal ROUND0110 initially generated by the round robin counter circuits of Section 20-80.

More specifically, when both signals DBANK0000 and DBANK1000 are binary ONES, the state of signal ROUND0110 changes as a function of signal ROUND0010. Therefore, the round robin counting sequence proceeds normally.

However, when signal DIRPE0000 switches to a binary ZERO, signal DBANK0000 switches to a binary ZERO. This causes NAND gate 20-895 to force signal ROUND0110 to a binary ONE state. The most significant bit ROUND0110 signal remains a binary ONE as long as signal DBANK0000 is a binary ZERO. Accordingly, the round robin counting sequence is altered so as to only specify levels 2 and 3.

Similarly, when signal DIRPE1000 switches to a binary ZERO, signal DBANK1000 switches to a binary ZERO. This causes NAND gate to force signal ROUND0200 to a binary ONE. The result is that NAND gate 20-895 forces most significant bit signal ROUND0110 to a binary ZERO. This alters the round robin counting sequence so that only levels 0 and 1 are specified. Additionally, signals DBANK0000 and DBANK1000 are applied as inputs to pairs of the comparator circuits of Section 20-42. Thus, the pairs of comparator circuits are inhibited from generating hit signals as a function of the states of signals DBANK0000 and DBANK1000.

Additional gates 20-897, 20-898, 20-900 and 20-906 are used to report to the CPU 10 when the cache is operating in a degraded mode, has signalled the occurrence of a directory parity error as a memory yellow or correctable error condition and when the cache is being placed off-line, signalled as a memory red or uncorrectable error condition. More specifically, OR gate 20-900 combines a yellow error signal YELLOW010 with a bus cache yellow signal CADYL0110 to produce memory yellow error signal CADYL0010 which is applied to the control lines of bus 18. A further D-type flip-flop 20-891 is used to store the occurrence of a first valid parity error, which results in signal YELLOW010 being forced to a binary ONE.

Also, the binary ZERO outputs from flip-flops 20-892 and 20-894 are applied to NAND gate 20-906. When either flip-flop switches to a binary ONE causing the degrading of cache unit 20, NAND gate 20-906 forces signal DGRADE010 to a binary ONE. This signal is applied to a check indicator for signalling when the cache is operating in a degraded mode.

When both flip-flops 20-892 and 20-894 are binary ONES, then NOR gate 20-897 forces signal DIR-RED010 to a binary ONE state which is forwarded to CPU 10 via OR gate 20-898 for signalling the occurrence of an uncorrectable condition. The output signal PARERR010 from NAND gate 20-887 is inverted by gate 20-903 to produce signal PARERR000 which is combined in NAND gate 20-902 with cache hit signal CACHIT110 generated by NAND gate 20-902. The resulting signal CACHIT200 is forwarded to section 20-10 and is used to generate a main memory request as in the case of a normal cache miss condition.

ADDRESS, REPLACEMENT AND UPDATE LOGIC SECTION 20-10

Figure 3D:
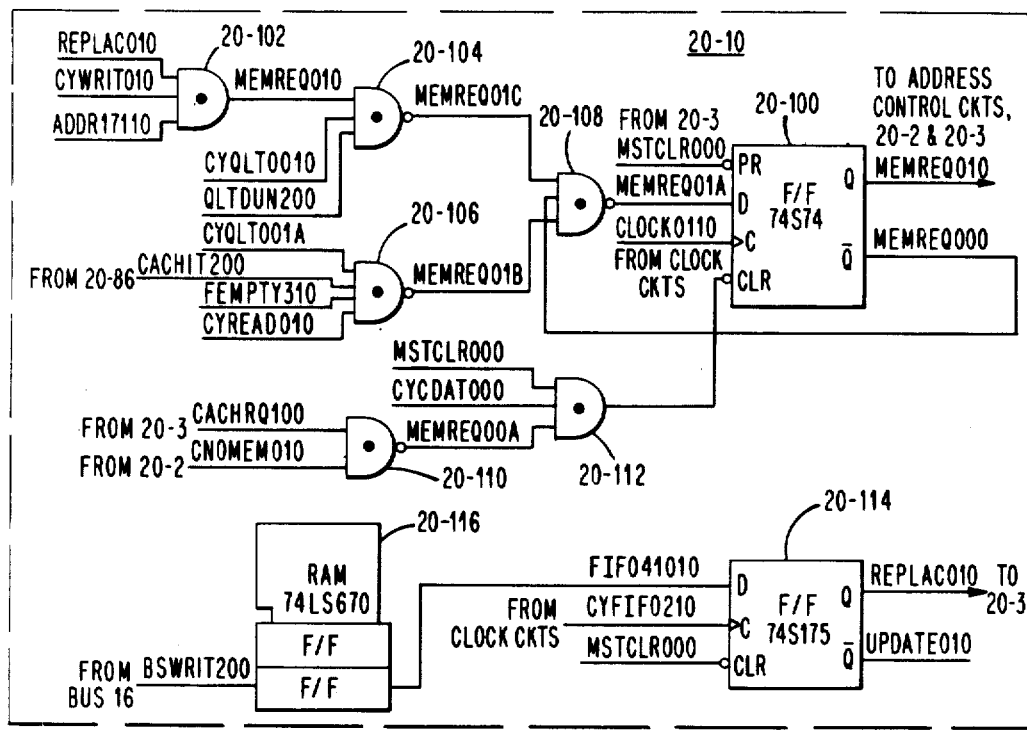
FIG. 3d shows a portion of the replacement circuits of the cache unit of FIG. 1.

A portion of the replacement circuits of block 20-10 are shown in greater detail in FIG. 3d. These circuits include a memory request cycle flip-flop 20-100 and associated gates 20-102 through 20-112, and a replacement/update flip-flop 20-114 which couples to a first in first out (FIFO) storage 20-116.

The memory request cycle flip-flop 20-100 is switched to a binary ONE during initialization when a master clear signal MSTCLR00 applied to a preset terminal (PR) is forced to a binary ZERO. This causes the cache unit 20 to be initialized to a known state as explained herein. During a replacement operation (i.e., when signal REPLAC010=1) during a write cycle of operation (CYWRIT010=1) when address bit 17 is a binary ONE (i.e., signal ADDR17110=1), AND gate 20-102 forces signal MEMREQ01D to a binary ONE. Signal MEMREQ01D conditions NAND gate 20-104 to force signal MEMREQ01C to a ZERO when the QLT flip-flop (not shown) is a binary ONE (i.e., signal CYQLT0010=1) and the QLT operation has not been completed (i.e., signal QLTDUN 200=1). When a binary ZERO, signal MEMREQO1C causes NAND gate 20-108 to force signal MEMREQ1A to a binary ONE when flip-flop 20-100 is in a binary ZERO state and signal MEMREQO1B is a ONE. When clocking signal CLOCK0110 goes positive, signal MEMREQ1A switches flip-flop 20-100 to a binary ONE.

These circuits operate to initialize cache unit 20 as follows. Signal MSTCLR000 when switched to a binary ZERO, causes memory request flip-flop 20-100 to switch to a binary ONE state. Signal MEMREQ010 conditions address control circuits included as part of section 20-10 and bus circuits of section 20-3 to initiate memory read request to main store 12 via bus 10. The first cache read request applies an even address to main store 12 while the second cache request applies an odd address to main store 12. When both words are received, this forces a data cycle signal CYCDAT000 to a binary ZERO which resets memory request flip-flop 20-100 to a binary ZERO.

During the second data cycle, signals REPLAC010, CYWRIT010 and ADDR17110 are all binary ONES. This causes AND gate 20-102 to force signal MEM-REQ010 to a binary ONE which causes NAND gate 20-104 to force signal MEMREQ01C to a binary ZERO. When clock signal CLOCK0110 switches positive, memory request flip-flop 20-100 is again switched to a binary ONE. This initiates another cache read request to main store 12. When the last word (e.g. 4096th) is requested from main store 12 is being transferred from main store 12, AND gate 20-102 again forces signal MEMREQ01D to a binary ONE. However, signal QLTDUN200 has been switched to a binary ZERO signalling the end of the initialization operation. This inhibits memory request flip-flop 20-100 from being set to a binary ONE again. At the completion of the initialization operation, cache store section stores the contents of the first 4096 locations of main store 12 while directory section 20-8 stores the row addresses of the addresses of the first 4096 main store locations. For further information regarding the initialization procedure, reference may be made to U.S. Pat. No. 4,190,885.

Additionally, in the absence of a QLT cycle (i.e., signal CYQLT00A = 1), when the requested data is not stored in cache (i.e., signal CACHIT200 = 1), the FIFO storage 20-116 is empty (i.e., signal FEMPTY310 = 1) and during a cache read cycle of operation (i.e., signal CYREAD010 = 1), NAND gate 20-106 operates to force signal MEMREQ01B to a binary ZERO. This causes NAND gate 20-108 to force signal MEMREQ01A to a binary ONE which switches flip-flop 20-100 to a binary ONE in response to clocking signal CLOCK0110. Additionally, flip-flop 20-100 also switches to a binary ONE, in response to signal CLOCK010, when signal MEMREQ000 is a binary ZERO. The memory request flip-flop 20-100 is reset to a binary ZERO, in response to master clear signal (i.e., signal MSTCLR100 = 0), during a data cycle (i.e., signal CYCDAT000 = 0), or in the absence of a CPU request (i.e., signal CACHRQ100 = 1) when see no memory flip-flop of section 20-3 is set to a binary ONE (i.e., signal CNOMEM010 = 1).

The FIFO buffer 20-116 contains four RAM 44-bit, registers which couple to bus 16 and are conditioned for storing the information received from bus 16. This information includes the state of the bus write control line BSWRIT. When signal BSWRIT200 is a binary ONE, the memory command received from bus 16 is a read command. A memory write command is denoted by signal BSWRIT200 being a binary ZERO.

When signal FIF041010 is a binary ONE, the replace/update flip-flop 20-114 is switched to a binary ONE when FIFO cycle signal CYFIF0210 goes positive. When in a binary ONE state, flip-flop 20-114 forces signal REPLAC010 to a binary ONE signalling that a cache replacement cycle is to be performed. That is, a replacement cycle occurs when CPU 10 generates cache request signal CACHRQ010 and the requested information is not stored in cache. The cache unit 20 generates a request to main store 12 over bus 16 and the requested information received from main store is sent to CPU 10 and written into cache section 20-4 completing the replacement operation.

When CPU 10 generates memory write request to main store 12 which updates information in main store 12, the cache unit 20 checks to see if the information is also stored in section 20-4. When it is, section 20-4 information is updated with the new information. In this case, signal FIF041010 is a binary ZERO which causes flip-flop 20-114 to be switched to a binary ZERO. Signal UPDATE010 when forced to a binary ONE signals that a cache update cycle is to be performed. Replace/update flip-flop 20-114 is reset when master clear signal MSTCLR000 is switched to a binary ZERO.

BUS INTERFACE SECTION 20-2

Figure 3E:
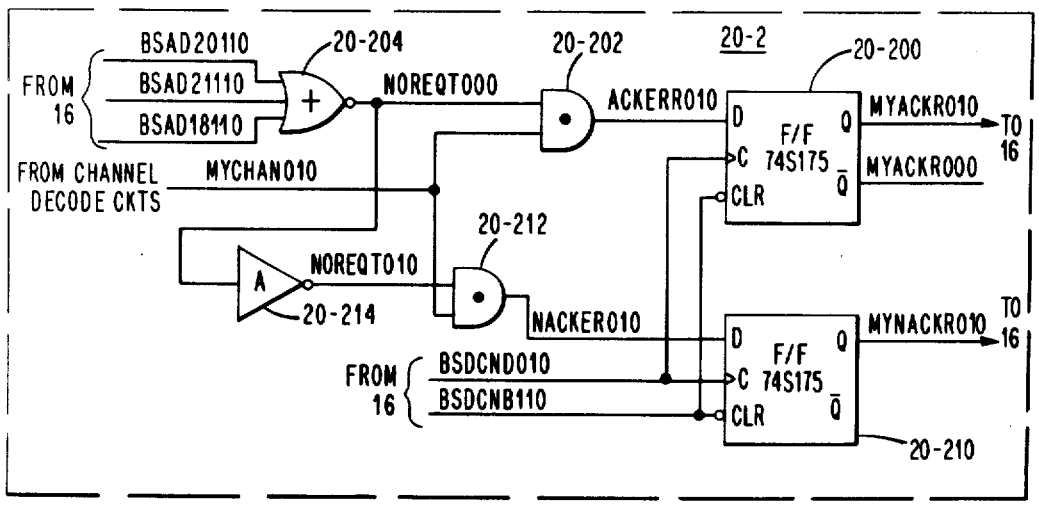
FIG. 3e shows a portion of the bus interface circuits of the cache unit of FIG. 1.

FIG. 3e shows in greater detail, a portion of the circuits of section 20-2. These circuits include a memory acknowledgement flip-flop 20-200 and associated gates 20-202 and 20-204, in addition to a negative acknowledgement flip-flop 20-210 with associated gate 20-212 and inverter circuit 20-214. Both flip-flops are connected to receive signals BSAD18110-20110 representative of bus address bits 18, 20 and 21. These bits correspond to a function code which is applied to the address lines of bus 16 along with the cache command applied to the data lines of bus 16. Additionally, a channel number is applied to the address lines of bus 16. When the channel number corresponds to the cache unit 20, my channel signal MYCHAN010 is forced to a binary ONE.

NOR gate 20-204 forces signal NOREQT000 to a binary ONE when signals BSAD18110, BSAD21110 and BSAD20110 are binary ZEROS. This, in turn, causes AND gate 20-202 to force signal ACKERR010 to a binary ONE. During the data cycle portion of the bus cycle of operation signal BSDCND010 is switched positive which sets memory acknowledgement flip-flop 20-200 to a binary ONE. The flip-flop 20-200 is reset at the end of the data cycle which signal BSDCNB110 switches to a binary ZERO.

When NOR gate 20-204 switches signal NOREQT000 to a binary ONE, inverter circuit 20-214 switches signal NOREQT010 to a binary ZERO. This causes AND gate 20-212 to switch signal NACKER010 to a binary ZERO. Thus, negative acknowledgement flip-flop 20-210 is switched to a binary ZERO in response to signal BSDCND010. When one of the signals BSAD18110, BSAD21110 or BSAD20110 is a binary ONE, NOR gate 20-204 forces signal NOREQT000 to a binary ZERO. Thus, AND gate 20-202 forces signal ACKERR010 to a binary ZERO while AND gate 20-212 forces signal NACKER010 to a binary ONE when channel number signal MYCHAN010 is a binary ONE. The bus response signals MYACKR010 and MYNAKR010 are applied to the control lines of bus 16 for signalling CPU 10 whether or not the cache unit 20 has accepted the command.

TEST MODE SECTION 20-3

Figure 4:
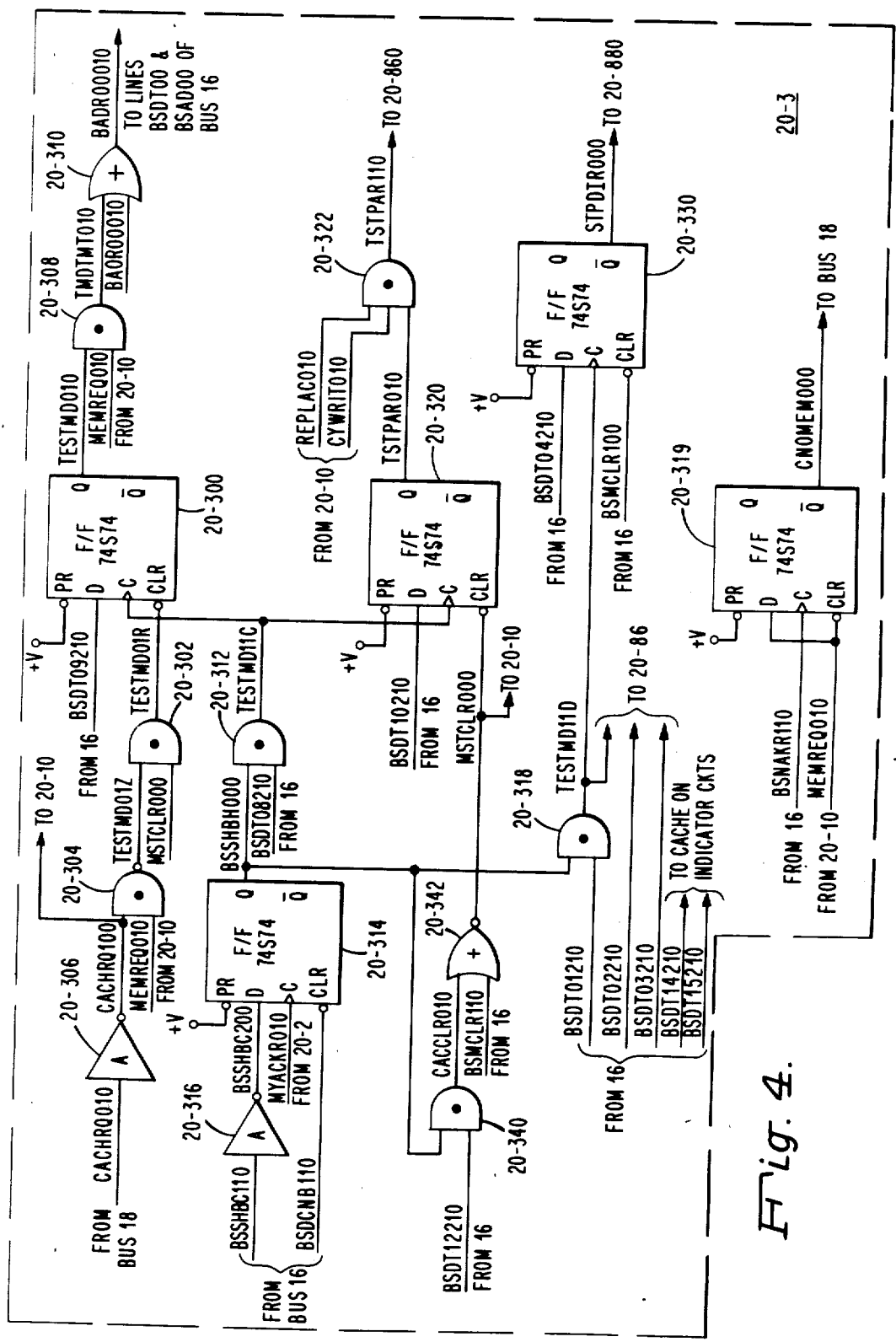
FIG. 4 shows in greater detail, the test mode of the present invention.

FIG. 4 shows in greater detail, the test mode circuits of section 20-3 constructed according to the principles of the present invention. These circuits include a "no hit fault" mode flip-flop 20-300 with associated gates and inverter circuits 20-302 through 20-316. Flip-flop 20-300 is is switched to a binary ONE when bus data signal BSDT09210 is forced to a binary ONE upon clocking signal TESTMDIIC being forced positive. AND gate 20-312 forces signal TESTMDIIC positive when bus data signal BSDT08210 is a binary ONE and flip-flop 20-314 has been switched to a binary ONE state. The flip-flop 20-314 is switched to a binary ONE when a second half bus cycle signal BSSHBC110 is a binary ZERO, upon my acknowledgement signal MYACKR010 being switched positive by the circuits of section 20-2. Flip-flop 20-314 is reset to a binary ZERO when signal BSDCNB110 is forced to a binary ZERO.

No hit fault flip-flop 20-300 is reset to a binary ZERO when AND gate 20-302 forces signal TESTMD01R to a binary ZERO, in response to a master clear signal (i.e., signal MSTCLR000 = 1), or when NAND gate 20-304 forces signal TESTMD01Z to a binary ZERO. NAND gate 20-304 forces signal TESTMD01Z to a binary ZERO when cache request signal CACHRQ010 from CPU 10 is a binary ZERO and memory request signal MEMREQ010 is forced to a binary ONE by the circuits of section 20-10. Signal MSTCLR000 is forced to a binary ZERO via a NOR gate 20-342 when an AND gate 20-340 forces a cache clear signal CACCLR010 to a binary ONE or when the system of FIG. 1 is initialized causing a bus master clear signal BSMCLR110 to be forced to a binary ONE. Signal CACCLR010 is forced to a binary ONE in response to a cache initialize command which forces bus data signal BSDT12210 to a binary ONE when signal BSSHBH000 is a binary ONE.

The binary ONE output signal TESTMD010 from "no hit fault" flip-flop 20-300 is combined with memory request signal MEMREQ010 in AND gate 20-308. When signals TESTMD010 and MEMREQ010 are binary ONES, AND gate 20-308 forces signal TMDTMT010 to a binary ONE causing OR gate 20-310 to force the most significant address bit signal BADR00010 to a binary ONE. The signal BADR00010 when a binary ONE is representative of a non-existent memory address. This causes the main store 12 to force the bus negative acknowledgement line BSNAKR to a binary ONE. Signal BSNAKR110 when forced to a binary ONE switches a see no memory flip-flop 20-319 to a binary ONE when memory request signal MEMREQ010 is a binary ONE. When a binary ONE, flip-flop 20-319 forces signal CNOMEM000 to a binary ZERO which signals CPU 10 via bus 18 that a non-existent address/resource was specified by the memory request.

Additionally, signal BSSHBH000 is applied as an input to AND gate 20-318. AND gate 20-318 receives bus data signal BSDT01210. When both signals are binary ONES, AND gate 20-318 forces signal TESTMDllD to a binary ONE. This signal is applied to the clock input terminals of bank mode flip-flops 20-892 and 20-894 of section 20-86 enabling their states to be established as a function of bus data signals BSDT02210 and BSDT03210 applied via section 20-3. Also, bus data signals BSDT14210 and BSDT15210 coded for specifying a cache bypass mode of operation are applied via section 20-3 to cache on indicator circuits used for signalling CPU 10 when cache unit 20 has been placed in a bypass or off-line state.

Additionally, the test mode" circuits include a "force directory parity mode" flip-flop 20-320, as shown. This flip-flop is switched to a binary ONE when bus data signal BSDT10210 is forced to a binary ONE, upon clocking signal TESTMDllC being forced positive. The flip-flop 20-320 is reset to a binary ZERO when master clear signal MSTCLR000 is forced to a binary ZERO. The binary ONE output signal TSTPAR010 of flip-flop 20-320 is applied as one input to AND gate 20-322. AND gate 20-322 also receives replace signal REPLAC010 and cache write signal CYWRIT010 from section 20-10. When all three signals are binary ONES, AND gate 20-322 forces test parity signal TSTPARI10 to a binary ONE. This signal when a binary ONE conditions the parity generator circuits 20-861 and 20-862 to produce invalid parity signals as discussed herein.

Lastly, the test mode circuits include an enable/disable parity flip/flop 20-330. This flip-flop is switched to a binary ONE when bus data signal BSDT04210 is a binary ONE, upon signal TESTMD110 being forced positive. When a binary ONE, flip-flop 20-330 forces stop directory signal STPDIR000 to a binary ZERO. Signal STPDIR000 is applied to the circuits 20-86 for inhibiting the operation of the error checking and error reporting circuits as explained herein. Flip-flop 20-330 is reset to a binary ZERO when a bus clear signal BSMCLR100 is forced to a binary ZERO.

DESCRIPTION OF OPERATION

With reference to FIGS. 1 through 5, the preferred embodiment of the test mode apparatus of the present invention will now be described with reference to the flow diagram of FIGS. 6–7.

Cache Unit 20

Figure 7:
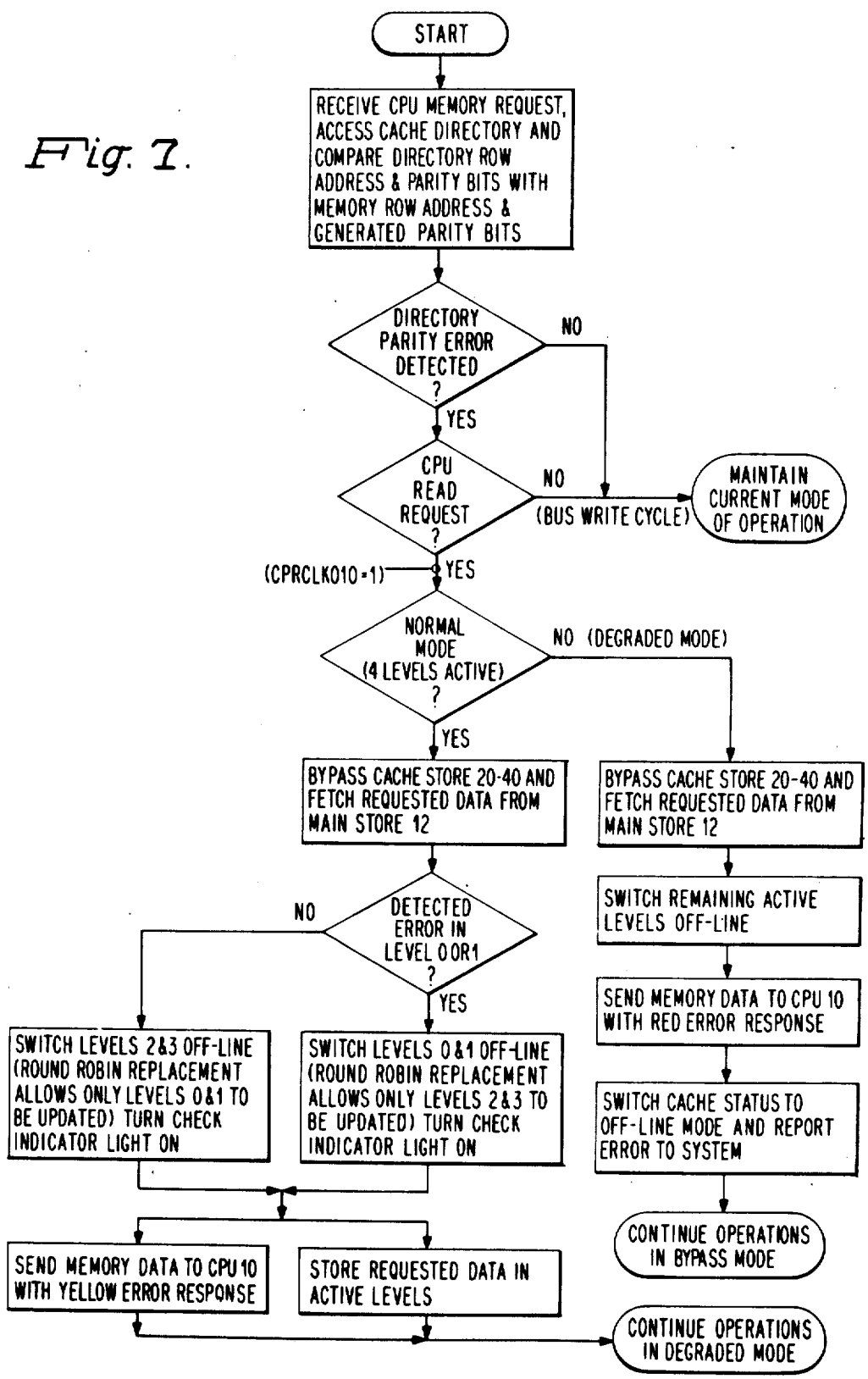
FIG. 7 is a flow diagram which illustrates the operations performed by the cache unit of FIG. 1.

However, before proceeding with the above, it would facilitate an understanding of the present invention to first describe the operation of the cache unit of the preferred embodiment with reference to the flow diagram of FIG. 7.

The cache unit 20 provides for graceful degradation by causing mode transitions proceeding from a normal mode of operation wherein all four cache levels are operative or active to a degraded mode of operation wherein two levels are operational or active and then to a bypass mode of operation wherein no levels are operational or active. The flow diagram of FIG. 7 illustrates how the occurrences of these mode transitions take place.

It is assumed that the cache unit 20 has been initialized and is operating normally. By way of example, successful read requests are issued by CPU requesting data which has been stored in cache and whose access produces a directory parity error. When CPU 10 issues a memory read request to the cache unit 20 of FIG. 1, the 20 bit main memory address is applied to the address lines of interface 18 together with the appropriate bus control signals.

From FIG. 2, it is seen that the 10-bit column address corresponding to signals through ADDR17200 are applied to the various portions of the directory and cache sections 20-8 and 20-4. Also, at that time, the 10-bit row address corresponding to signals ADDR0010 through ADDR0710, signals ADDR0A10 and ADDR0B10 being applied to the hit/miss control circuits 20-42.

The column address applied to cache directory 20-84 of FIG. 2 causes the read out of a row address from each of the four directory levels. since this is a read operation, the driver circuits 20-863 of FIG. 3c are disabled. Accordingly, the row address corresponding to signals HDAT00B10 through HDAT39B10 are applied as inputs to the comparator circuits 20-420 through 20-426.

In parallel with the above, the parity generation circuits 20-861 and 20-862 of FIG. 3c generate parity bit signals DPBIT0010 and DPBIT1010 from the input row address. Since this is a read operation, the driver circuits 20-864a through 20-864d are inhibited. Accordingly, the sets of parity bit signals read out from the directory levels are applied as inputs to comparator circuits 20-869a through 20-869d.

The comparator circuits 20-420 through 20-426 are operative to compare the four directory row addresses with the memory request row address. Since it is assumed that the data being requested has been stored in cache store 20-40, one of the comparator circuits is operative to force one of the hit signals HIT000010 through HIT003010 to a binary ONE state indicative of the hit condition. Simultaneously, comparator circuits 20-866a through 20-866d are operative to compare the directory address parity bits with the parity bits generated from the memory row address.

Since it is assumed that the read request produces a directory parity error, one of the comparator circuits 20-866d through 20-866d is operative to force one of the hit enable signals to a binary ONE state. When the directory parity error occurs in the subdivision or set of levels from which the requested data is stored (i.e., where the hit occurred), then NAND gate 20-887 is operative to force directory parity error signal PARERR010 to a binary ONE.

Signal PARERR010 is generated approximately 90 nanoseconds following receipt of the memory request. Since this is a read request, approximately 40 nanoseconds later, signal PARERR010 is clocked into flip-flop 20-888 in response to timing signal CPRCLK010 from the clock circuits of Section 20-10. This results in parity error valid signal PARERR110 being forced to a binary ONE. This signal immediately gates the states of hit invalid signals DIRPE0010 and DIRPE1010 into degrade mode flip-flops 20-892 and 20-894.

From the flow chart of FIG. 7, it is seen that the detection of the directory parity error as signalled by signal PARERR110 results in the cache store 20-40 being bypassed and the requested data being fetched from main store 12. More specifically, the generation of a hit condition when signalled by the circuits 20-42 causes NAND gate 20-902 to force cache hit signal CACHIT110 to a binary ONE state. However, signal PARERR000 was forced to a binary ZERO when NAND gate 20-887 was switched to a binary ONE by one of the signals PARERRA00 through PARERRD00 being switched to a binary ZERO. This inhibits NAND gate 20-904 from switching signal CACHIT200 to a binary ZERO state. The result is that signal CACHIT200 causes the circuits of Section 20-10 to generate a memory request which is forwarded to main store 12.

As seen from FIG. 4, the circuits 20-880 of FIG. 3c establish in which subdivision of cache the directory parity error occurred. More specifically, the states of degrade mode flip-flops 20-892 and 20-894 define which set or subdivision of levels are to be disabled.

It is assumed that the directory parity error occurred when data stored in level 0 was being accessed. Accordingly, cache operation proceeds to switch levels 0 and 1 off line as shown in FIG. 4. That is, flip-flop 20-892 is switched to a binary ONE state approximately 150 nanoseconds from the receipt of the memory request.

The result of the above switching forces degraded mode signal DBANK0000 to a binary ZERO. Signal DBANK1000 remains in a binary ONE state. Accordingly, NAND gate 20-895 switches the most significant round robin bit signal ROUND0110 to a binary ONE. This occurs approximately 5 nanoseconds following the switching of signal DBANK0000. Signal DBANK0000 causes NAND gate 20-895 to maintain the round robin bit signal ROUND0110 in a binary ONE state. Thus, the round robin counter section 20-80 of FIG. 3a effectively permits memory data to be replaced only within levels 2 and 3. Additionally, the binary ZERO signal DBANK0000 disables the level 0 and level 1 comparator circuits 20-420 and 20-422 of FIG. 2. Thus, levels 0 and 1 remain off-line relative to the processing of subsequent memory read requests.

As seen from FIG. 7, valid parity error signal PARERR110 forces yellow error response signal CADYL0010 to a binary ONE. As soon as the requested data from main store 12 is received by the cache unit 20, it is written into the next location of the level specified by the round robin level signal as modified by the circuits 20-880. That is, the replacement circuits of Section 20-10 are operative to force replace signal REPLAC010 to a binary ONE indicative of the replacement operation. This results in write cycle signal CYWRIT010 being forced to a binary ONE by the replacement circuits of Section 20-10.

As seen from FIG. 3a, signal CYWRIT010 causes the level signals ROUND0A10 and ROUND1A10 read out from round robin counter chips 20-800 and 20-802 in response to the memory request column address to be loaded into flip-flops 20-804 and 20-806. As mentioned previously, the most significant bit round robin counter is modified by the state of flip-flop 20-892 of FIG. 3c and is applied to the write control circuits of block 20-82. Since the cache unit 20 is carrying out a replacement operation, select signals SEL001010 and SEL000010 of FIG. 3b are generated as a function of round robin counter signals ROUND1010 and ROUND0110.

In greater detail, the binary ONE state of signal ROUND0110 when inverted, causes NOR gate 20-844 to force select signal SEL000010 to a binary ONE. Select signal SEL001010 is forced to a binary ONE or ZERO as a function of the state of signal ROUND1010. Upon the generation of write pulse signal WRTPLS110, by the replacement circuits of block 20-10, decoder circuit 20-848 forces either write signal WRITE2C00 or WRITE3C00 to a binary ZERO. Similarly, the circuits 20-850 through 20-856 force either write signal WRITE2010 or WRITE3010 to a binary ONE. Accordingly, the data from main store 12 is only written into level 2 or level 3 of the cache directory 20-84 and cache store 20-400.

As seen from FIG. 2, the memory request row address is written into the cache directory levels in response to signal WRITE2C00 or WRITE3C00. In the case of cache store 20-400, the signal WRITE2010 or WRITE3010 causes the select logic circuits 20-430 to force the appropriate one of the chip select signals CHIPS2000 or CHIPS3000 to a binary ZERO for enabling the level 2 or level 3 RAM chips. The data received from main store 12 corresponding to signals DATA00A10 through DATA19A10 is written into the location specified by column address in response to write signal WRITE2C00 or WRITE3C00.

As seen from FIG. 7, as the requested data is being written into cache store 20-400, it is forwarded to CPU via interface 18 along with yellow error response signal CADYL0010. Thereafter, the cache unit 20 continues to process memory requests in degraded mode.

As seen from FIG. 7, cache unit 20 continues to operate in the degraded mode until a further directory parity error is detected within the active or remaining cache levels which correspond to levels 2 and 3 in this example.

It will be assumed that the next memory read request which produces the error specifies accessing data stored within levels 2 or 3. In the manner described above, the circuits of Section 20-86 of FIG. 3c generate signals which result in hit invalid signal DIRPE1010 being forced to a binary ONE. Since this is a read request, flip-flop 20-888 is again switched to a binary ONE. This time parity error valid signal PARERR110 causes NAND gate 20-890 to force signal DIRPE1000 to a binary ZERO which switches degrade mode flip-flop 20-894 to a binary ONE.

As seen from FIG. 3c, signal DBANK1000 is switched to a binary ZERO which causes NOR gate 20-897 to force signal DIRRED010 to a binary ONE. This forces red error response signal CADRED010 to a binary ONE.

As seen from FIG. 7, the binary ZERO state of signal DBANK1000 causes active levels 2 and 3 to be switched off-line by disabling comparator circuits 20-426 and 20-428 of FIG. 2. The cache unit 20 operates to fetch data from main store 12 in the manner previously described. Upon receipt, the data is forwarded to CPU 10 via interface 18 along with red error response signal CADRED010. As seen from FIG. 4, CPU 10 can then take the necessary actions to generate status information indicating that cache unit 20 has been placed in a bypass or off-line mode of operation.

It will be appreciated that if the directory parity error first occurred when data stored within levels 2 and 3 was being accessed then levels 2 and 3 would be placed off-line as indicated in FIG. 4. More specifically, flip-flop 20-894 of FIG. 3c is switched to a binary ONE while flip-flop 20-892 remains in a binary ZERO state. Accordingly, this causes NAND gate 20-895 to force the most significant round robin counter bit signal ROUND0110 to a binary ZERO state. Accordingly, during replacement operations, data is permitted to be written only into levels 0 and 1 of cache directory 20-84 and cache store 20-400. That is, the circuits of Section 20-82 are conditioned by the state of signal ROUND0110 to force only write signals WRITE0C00 and WRITE1C00 to binary ZEROS and signals WRITE0010 and WRITE1010 to binary ONES.

Test Mode Section 20-3

Figure 5:
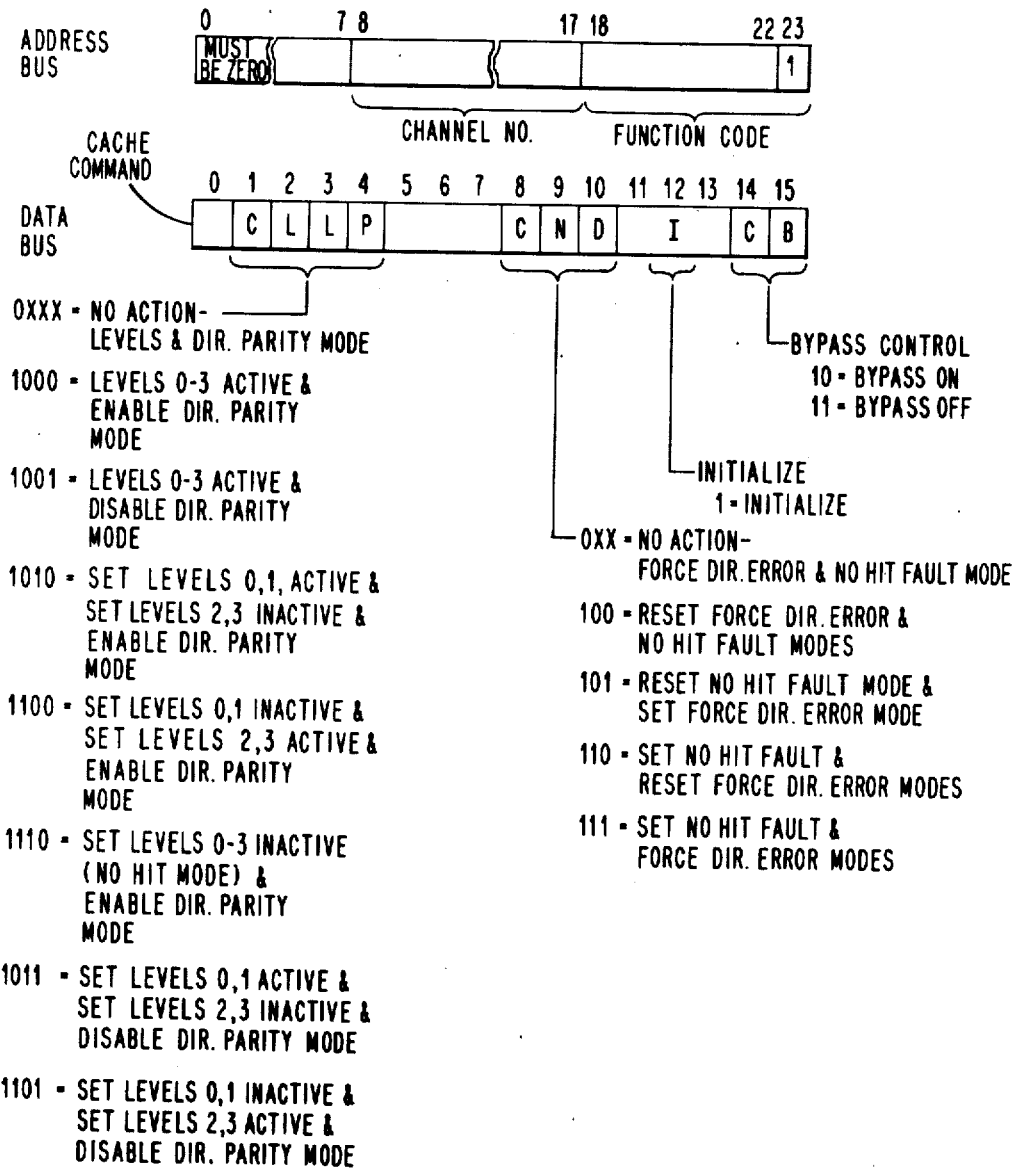
FIG. 5 shows the format of the commands used by the test mode apparatus of the present invention.

In accordance with the present invention and consistent with the convention established for transfers over bus 16, the format of FIG. 5 is used for information applied to the address and data lines of bus 16. As seen from the Figure, the 23 bits of information applied to the address lines include a 10-bit channel number code and a 6-bit function code. The number code and function code are loaded into one of the CPU's general registers (i.e., R6) as a first operand for reference by a rescan configuration (RSC) instruction.

The 16-bit cache command is coded to specify the action required to be performed by cache unit 20. These 16 bits are loaded into another one of the CPU's general registers (i.e., R7) as a second operand of the RSC instruction. The RSC instruction causes CPU 10 to transmit the contents of R7 along with the function code and channel number stored in R6. When the function code bits 18, 20 and 21 are all binary ZEROS, cache section 20-2 of FIG. 3e generates memory acknowledgement response signal MYaCKR010 on bus 16 and cache unit 20 initiates the sequence of operations required for carrying out the cache operation specified.

In greater detail, a first field of bits 1–4 are coded to enable reconfiguration of the active cache levels, in addition to the enabling/disabling of directory parity circuits. As shown, bit 1 of the field serves as a clocking bit. When this bit is a binary ONE, it enables a change in the active levels and mode of operation of the directory parity circuits. Bits 2–3 of the field are coded to define the states of the active levels as indicated. Bit 4 of the field establishes the mode of operation of the directory parity circuits.

The next field includes bits 8–10 which are coded to establish the error mode of operatfon for the directory parity circuits, in addition to modes of operation for the no hit fault circuits of section 20-3. Again, bit 8 serves as a clocking bit. The field consisting of bit 12 is coded to specify an initialization mode of operation. The last field of bits 14–15 are used to specify a bypass mode of operation in which bit 14 also serves as a clocking bit. While the last two fields specify operations which are employed in other systems, such as the system disclosed in U.S. Pat. No. 4,190,885, discussed above. These modes are combined with the apparatus of the present invention to facilitate the testing of the cache unit 20.

Figure 6:
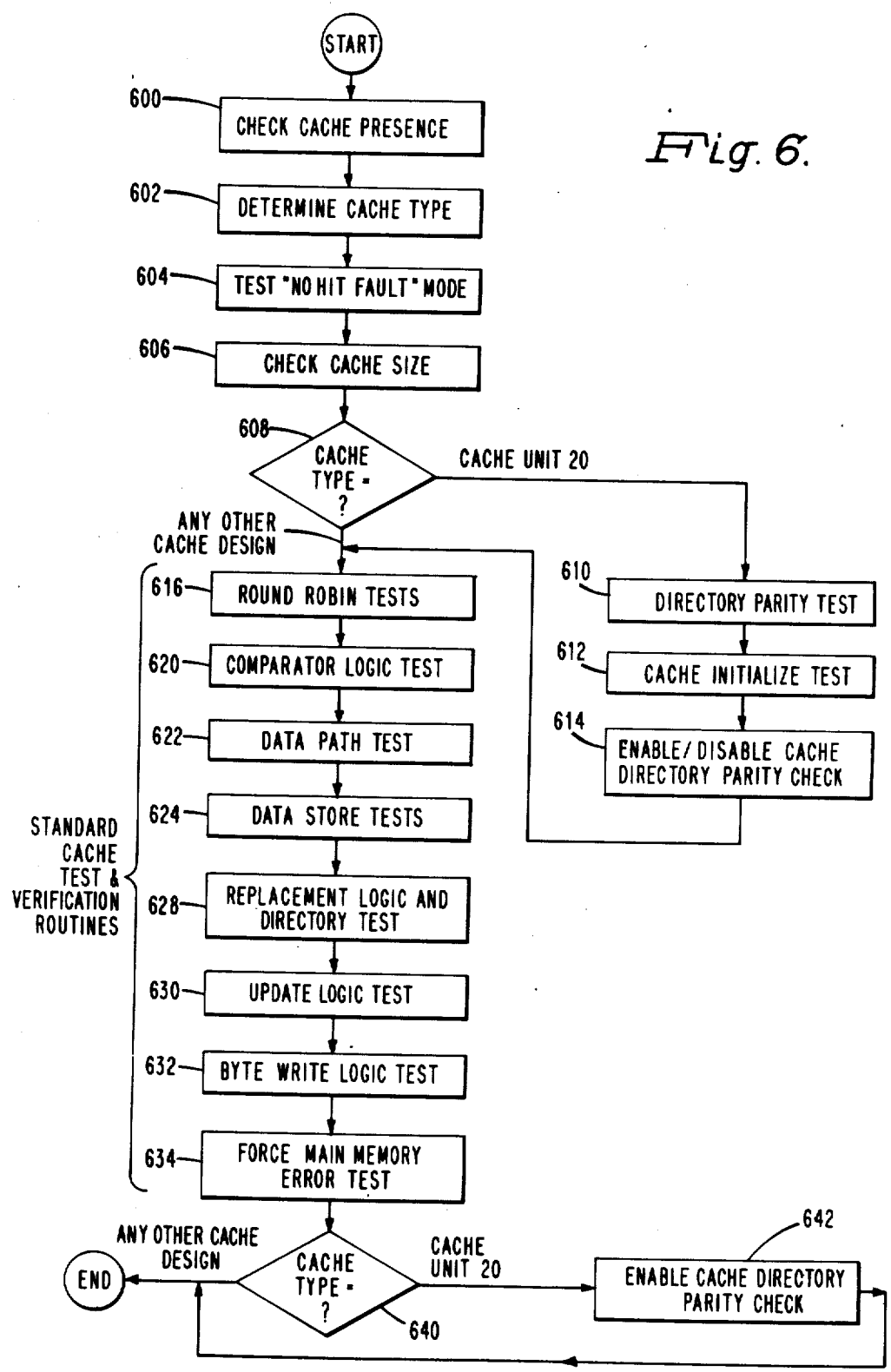
FIG. 6 is a flow diagram used in explaining the operation of the apparatus of the present invention.

Referring to FIG. 6, it is seen that first CPU 10 identifies that cache unit 20 is present by performing the cache presence check of block 600. This is done by having CPU 10 execute an RSC instruction whose first operand contains the channel number assigned to cache unit 20 (i.e., done by switch settings on cache board) and a function code of hexadecimal "01". The second operand contains a cache command code of 2 which specifies that the cache unit 20 is operating in a bypass mode.

The circuits of block 20-2 of FIG. 3e are operative to acknowledge the command by forcing my acknowledgement signal MYACKR010 to a binary ONE.

When applied to bus 16, this signal sets a cache flag indicator register within CPU 10 to an appropriate value. CPU 10 tests the state of the indicator via a compare instruction.

The cache command code upon being decoded causes a cache on flip-flop, not shown, to be switched to a binary ZERO state. This, in turn, switches one of the control lines of bus 18 to a predetermined state which signals CPU 10 that the cache unit 20 has been bypassed (placed off line).

Since signal MYACKR010 was previously received, CPU 10 executes another RSC instruction, which performs the operations of block 602. The first operand of the RSC instruction contains the assigned channel number and a non-zero function code of hexadecimal "26". The second operand has the same value hexadecimal "02". This instruction is used to determine the type of cache unit. The response to this test instruction is stored and used in a manner which enables the same cache test and verification routines designed for other earlier cache units to be employed. That is, in greater detail, the function code of hexadecimal "27" conditions the NOR gate 20-204 of section 20-2 of FIG. 3e to switch negative acknowledgement flip-flop 20-210 to a binary ONE. The response signal MYNAKR010, applied to one of the control lines of bus 16, causes another cache flag indicator within CPU 10 to an appropriate value. In accordance with the teachings of the present invention, CPU 10 tests the state of this indicator and selectively enables or disables the cache directory parity circuits of block 20-880.

When a cache unit other than cache unit 20 receives the non-zero function code, bus interface circuits contained therein operate to again force memory acknowledgement signal MYACKR010 to a binary ONE. This response signal causes the same cache flag indicator to be set to a different value. Thus, by testing the state of the flag indicator, CPU 10 can determine the type of cache unit being tested.

As seen from FIG. 6, the CPU 10 checks the "no hit fault mode" circuits and the size of cache unit 20 as indicated in blocks 604 and 606. That is, CPU 10 executes an RSC instruction which applies a cache command value of hexadecimal "400B". This causes cache unit 20 to perform an initialize operation and set all four levels to an active/on state and enables directory parity checking.

As a result of the initialize operation, the cache unit 20 fills its directory and data sections 20-8 and 20-4 with the addresses and contents of the first 4096 word locations of main store 12. The round robin counter section 20-80 is set to replace level 0 contents when a next cache replacement cycle is initiated in response to a request from CPU 10. Next, CPU 10 sets the no hit fault mode flip-flop 20-300 of FIG. 4 to the on-state by issuing a cache command having the value hexadecimal "00C0". This forces both data bus bit signals BSDT08210 and BSDT09210 to binary ONES causing flip-flop 20-300 to switch to a binary ONE state.

The operation of the no hit fault mode flip-flop 20-300 is tested when CPU 10 issues a cache memory read request having an address value greater than hexadecimal "1000" (i.e., 4096). When the flip-flop 20-300 and the associated circuits are operating properly, there is no hit detected (i.e., signal CACHIT200=1). Thus, the circuits of section 20-10 of FIG. 3d operate to switch signal MEMREQ01B to a binary ZERO which, in turn, causes memory request flip-flop 20-100 to switch to a binary ONE. This forces signal MEMREQ010 to a binary ONE, which causes AND gate 20-308 to force bus address signal BADR00010 to a binary ONE.

The result is that the bus circuits of main store 12 force bus negative acknowledgement signal BSNAKR110 to a binary ONE which sets CNOMEM flip-flop 20-319 to a binary ONE. This results in a trap signal being forwarded to CPU 10. By testing the state of the control line of bus 18 to which trap signal CNOMEM000 is applied, CPU 10 can determine that a "no hit fault" condition was detected indicating that the no hit fault circuits are operating properly. Assuming that testing had proceeded properly, next CPU 10 issues a cache command having a value of hexadecimal "0080" which resets the "no hit fault" flip-flop 20-300 to a binary ZERO state which completes the operation of block 604.

CPU 10 performs the operation of block 606 by issuing a memory read request having a predefined address of 4K-1. Using the no hit fault mode circuits, CPU 10 can determine whether the size of the cache unit 20 is 2K or 4K. Since cache unit 20 has a size of 4K, no trap signal should be received by CPU 10.

As seen from FIG. 6, CPU 10 next tests the state of the cache flag indicator for determining what type of cache unit is being tested. If it is a cache unit other than cache unit 20, CPU 10 executes the series of standard test and verification routines of blocks 616 through 634. For the purpose of the present invention, these tests are carried out in a conventional manner.

Briefly, the round robin tests verify that the round robin circuits operate properly and replace the least recently replaced cache level on the next cache replacement cycle of operation. The comparator logic tests tests the cache comparator logic circuits which determine whether or not the contents of main memory location being requested is stored in cache memory section. The data path test checks the data paths through the cache unit during replacement cycles of operation and during cache update service cycles.

The cache data store tests verify that the cache memory section circuits are operating properly by writing and reading predetermined data test patterns. The replacement logic and directory test verifies that these sections of cache are operating properly. The update and byte write tests verify that the update and byte write logic circuits operate properly during update and byte operations. Lastly, the force main memory error test verifies that the cache circuits can properly report reportable errors in main memory data and signal uncorrectable errors.

Upon completing these standard tests, the testing of such cache units are complete. However, when CPU 10 determines by block 608 that the cache type is the same as cache unit 20, an additional group of tests of blocks 610 and 612 are performed. The test of block 610 verifies the operation of the directory parity check circuits and degradation control circuits of blocks 20-860 and 20-880 of FIG. 3c. This is carried out in the manner described in copending related patent application entitled "Directory Test Error Mode Control Apparatus", referenced herein.

The initialize test of block 612 verifies that cache initialization, replacement update and read hit logic circuits operate when degradation has occurred. This is carried out in the manner described in copending related patent application entitled "Test Apparatus for Testing a Multilevel Cache System with Graceful Degradation Capability", referenced herein.

Upon completing the cache initialization test, CPU 10 executes an RSC instruction which applies a cache command to cache unit 20 which has a value of hexadecimal "4800". This forces bus data signals BSDT01210 and BSDT04210 to binary ONES. As seen from FIG. 4, these signals cause enable/disable parity mode flip-flop 20-330 to a binary ONE. This forces signal STPDIR000 to a binary ZERO state which inhibits the parity error circuits of section 20-880.

By disabling the cache parity error circuits, the standard routines of blocks 616 through 634 can be performed as though they were being run on any other type of cache unit without interference from yellow and red signal indications generated because of automatic degradation. Once degradation is made to occur, by performing the directory test of block 628, CPU 10 can now find the directory location that failed and identify the location to the particular RAM chip that failed.

Referring to FIG. 6, it is seen that the standard cache test and verification routines of blocks 616 through 634 are repeated a number of times as denoted by block 644 shown in dotted lines. In the preferred embodiment, these routines are repeated four times. During a first pass, the cache unit 20 is initialized and all four levels are active, but the cache directory parity circuits are disabled. In this instance, automatic degradation of cache levels which otherwise would occur does not affect testing. During second and third passes, the cache unit 20 is initialized and levels 0 and 1, then levels 2 and 3, are active while the cache directory parity circuits are disabled. This tests out the operation of cache unit 20 in a degraded mode but allows the performance of a full test of the degraded cache unit.

During a fourth pass, cache unit 20 is initialized and all four levels are active. However, the cache directory parity circuits are enabled. This verifies and ensures that cache unit 20 does not have any directory parity problems through the examination of the red and yellow signal indications. Testing is completed when cache unit 20 performs the tests of blocks 616 through 634 with the directory parity circuits enabled.

It will be appreciated that not all of the standard tests are required to be performed during all four passes. For example, the data store tests of block 624 need only be performed during those passes in which all four levels are active. Additionally, tests such as the round robin tests of block 616 can be performed with either levels 0, 1 or levels 2, 3 active with or without the cache directory parity circuits enabled.

The various states of the cache levels are established via cache commands as described in detail in the above mentioned copending related patent application entitled "Test Apparatus for Testing a Multilevel Cache System with Graceful Degradation Capability".

The selective enabling/disabling of the cache directory parity circuits of section 20-880 is carried out by cache commands generated by CPU 10, in response to RSC instructions. As discussed above, the states of bus data signals BSDT01210 and BSDT04210 cause the selective enabling of enable/disable parity mode flip-flop 20-330 of section 20-3 of FIG. 4. That is, when signal BSDT04210 is a binary ONE, flip-flop 20-330 switches to a binary ONE which disables the circuits of block 20-880. When signal BSDT04210 is a binary ZERO, flip-flop 20-330 switches to a binary ZERO which enables the circuits of block 20-880.

From the foregoing, it is seen how the test mode apparatus of the present invention is able to permit the full testing of a cache unit which is automatically degradable using standard test routines. By including response circuits within the cache unit which provide a response which differs from those of other types of cache units, both of which are normally recognized by CPU 10, the CPU is able to condition the test mode apparatus of the present invention to enable such testing to be carried out using standard test routines.

It will be appreciated by those skilled in the art that many changes may be made to the preferred embodiment of the present invention without departing from its teachings. For example, while the preferred embodiment of the present invention provides for selective disabling of directory parity circuits, it also could have provided for selective disabling/enabling of other types of circuits, in response to cache commands which are included within cache unit 20 which conditioned it to operate in a fashion which precluded its testing by standard routines used in testing other types of cache units. Also, the types of standard tests, types of responses, commands and cache organization may be altered without departing from the teachings of the present invention.

To prevent undue burdening the description with matter within the ken of those skilled in the art, a block diagram approach has been followed with a detailed functional description of each block and specific identification of the circuits represented (e.g. chip type). The individual engineer is free to select elements and components such as flip-flop circuits, registers, gates, etc. from the individual's own background or available standard references (e.g. Texas Instruments Corporation catalogues).

It will be noted that the formats of the instructions were not disclosed herein, since the engineer is free to select alternate types of instructions. For further details and for additional background, reference may be made to the handbook titled "Series 60 (Level 6) Models 6/34, 6/36 and 6/43 Level 6 Minicomputer Handbook", published by Honeywell Information Systems Inc., Order Number AS22, Rev. 3, Copyright 1979.

While in accordance with the provisions and statutes there has been illustrated and described the best form of the invention, certain changes may be made without departing from the spirit of the invention as set forth in the appended claims and that in some cases, certain features of the invention may be used to advantage without a corresponding use of other features.

What is claimed is:

1. Test mode apparatus for testing the operation of an automatically degradable multilevel cache unit including cache data and directory address stores, each store being organized into the same number of levels of storage locations, checking means coupled to said directory store for detecting errors occurring during the process of accessing data stored in said cache storage locations and degradation mode control means coupled to said stores and operative in response to errors to automatically degrade the operation of said cache unit to those directory and cache store levels which are free from errors, said test mode apparatus being operatively coupled to a processing unit for receiving cache commands coded to specify the type of operation to be performed by said test mode apparatus, each cache command including a function code for defining the type of cache unit being tested and a command code including a first field coded to specify a type of enabling/disabling operation to be performed by said test mode apparatus, said test mode apparatus being coupled to said checking means and to said processing unit, said test mode apparatus including:

response control means coupled to said processing means, said response control means being operative in response to a predetermined value of said function code to generate a predetermined response to said processing unit signalling that said cache unit is an automatically degradable type of cache unit; and, enable/disable check mode control means being coupled to said checking means and to said processing unit, said processing unit being operative upon having received said predetermined response to apply a further cache command to said cache unit such that when said first field is set to a first value, said enable/disable mode control means is conditioned by said first value to switch to a first state inhibiting said checking means from causing said degradation mode control means to automatically degrade said operation or any of said levels of said cache unit so as to enable said processing unit to test said degradable type of cache unit using a series of standard tests.

2. The apparatus of claim 1 wherein said enable/disable check mode control means includes:

mode bistable means having an input and an output coupled to said checking means; and input gating means coupled to said processing unit and to said bistable means, said input gating means being operative in response to said first field having said first value to switch said mode bistable means to said first state for disabling said checking means and said input gating means being operative in response to said first field having a second value to switch said mode bistable means to a second state for enabling said checking means.

3. The test mode apparatus of claim 1 wherein said response control means includes:

input decode gating means coupled to said processing unit for receiving said function code; and, first and second bistable means coupled to said input decode gating means and to said processing unit, said input decode gating means being operative upon receipt of said function code having said predetermined value to switch said first bistable means to a first state for generating said predetermined response and said input decode gating means being operative upon receipt of said function code having other than said predetermined value to switch said second bistable means to said first state for generating another response for indicating that a different type of cache unit is being tested.

4. The apparatus of claim 3 wherein said processing unit includes means for receiving said responses during normal operation for determining device operating status, said predetermined type of response during said testing corresponding to a negative acknowledgement signal for identifying said automatically degradable type of cache unit and said another response corresponding to a positive acknowledgement signal indicating that said different type of cache is being tested.

5. The apparatus of claim 3 wherein said predetermined value equals ZERO.

6. The apparatus of claim 1 wherein said degradation mode control means includes a number of bistable elements, each element being coupled to said checking means for controlling a predetermined number of levels, said each bistable element being switched to a first state for automatically degrading said operation of said cache unit when said checking means detects an error in one of said addresses accessed from one of said predetermined number of levels of directory store associated therewith; and, first indicator means coupled to each of said number of bistable elements and to said processing unit, said indicator means being operative when said number of bistable elements are in said first state to generate an output signal to said processing unit for signalling an uncorrectable error, said check mode control means when in said second state inhibiting said number of bistable elements from being switched to said first state preventing the generation of said output signal.

7. The apparatus of claim 6 wherein said checking means includes:

error bistable means coupled to said degradation mode control means and to said enable/disable check mode control means, said error bistable means being operative when said check mode control means switches to a second state during each cache read cycle of operation to switch to a predetermined state indicating that said error is valid, said error bistable means when in said predetermined state conditioning different one of said number of bistable elements to switch to said first state to automatically degrade said operation of said cache unit and said error bistable means being inhibited by said check mode control means when in said first state from switching to said predetermined state preventing said different ones of said number of bistable elements from automatically degrading said operation of said cache unit and signalling said uncorrectable error.

8. The apparatus of claim 7 wherein said cache unit further includes second indicator means coupled to said error bistable means and to said processing unit, said second indicator means being conditioned by said error bistable means upon detecting the occurrence of a first error in accessing one of said directory store addresses, to switch to a first state for signalling a correctable error to said processing unit, said check mode control means when in said second state inhibiting said second indicator means from switching to said first state preventing signalling of said correctable error.

9. The apparatus of claim 6 wherein said cache unit provides fast access to main memory data in response to requests containing row and column addresses, and wherein said directory store locations store row addresses together with parity check bits for designating which of said cache levels store corresponding data and said directory locations being defined by said column addresses, said checking means further including parity generation circuit means coupled to receive said row addresses of said requests, and generate parity check bits for comparison with said parity check bits read out from said directory locations for switching said error bistable means to said predetermined state as a function of the state of said check mode control means.

10. The apparatus of claim 1 wherein said cache command code further includes other fields for initializing said cache levels to known states, said cache unit being coupled to a main store, said main store having a number of locations for storing sequences of instructions of said standard tests, said processing unit being operative prior to executing said plurality of standard tests during a first pass operation to apply a cache command having said first field specify a disabling type of operation and said other fields specifying a first cache normal mode of operation wherein said cache unit is initialized with all levels active, said enable/disable check mode control means being conditioned by said first field to switch to said first state inhibiting the operation of said checking means for testing said cache unit while being operated in said normal mode with said standard tests.

11. The apparatus of claim 10 wherein said processing unit prior to executing said plurality of standard tests during second and third pass operations applies successive cache commands each having said first field specify said disabling type of operation and said fields specify second and third cache degraded modes of operation respectively, wherein said cache unit is initialized and alternate one of said levels are active, said enable/disable check mode control means being conditioned by each of said first fields to switch to said first state inhibiting the operation of said checking means for testing said cache unit while being operated in said second and third degraded modes with said standard tests.

12. The apparatus of claim 11 wherein said processing unit prior to executing said plurality of standard tests during a fourth pass operation applies a further command having said first field specify the enabling type of operation and said other fields specify said first cache normal mode of operation, said enable/disable check mode control means being conditioned by said first field to switch to said second state enabling the operation of said checking means for testing said cache unit while being operated in said normal mode with said standard tests.

13. The apparatus of claim 10 wherein said processing unit upon completing said plurality of standard tests applies a further cache command having said first field specifying an enabling type of operation, said enable/disable check mode control means being conditioned by said first field to switch to a second state for enabling said checking means to automatically degrade said operation of said cache unit during the performance of said standard tests.

14. Test mode apparatus for testing the operation of a multilevel cache unit which includes mode control apparatus for altering the number of cache levels in response to errors, said test mode apparatus being operatively coupled to a processing unit for receiving cache commands coded to specify the type of operation to be performed by said test mode apparatus, each command including a function code for defining the type of cache unit under test and a command code including a first field coded to specify a type of enabling/disabling operation to be performed on said cache unit by said test mode apparatus, said test mode apparatus being coupled to said mode control apparatus and to said processing unit, said test mode apparatus including:
- device response means coupled to said processing means for generating responses for normally indicating the operational status of devices coupled thereto, said response means being operative in response to a predetermined value of said function code to generate a predetermined response to said processing unit signalling that said cache unit is a predetermined type of cache unit which includes said mode control apparatus; and,
- enable/disable check mode control means being coupled to said mode control apparatus and to said processing unit, said processing unit being operative upon having received said predetermined response from said cache unit to apply a further command to said cache unit such that when said first field set to a first value, said enable/disable mode control means is conditioned by said first value to switch to a first state in response to said first value inhibiting the operation of said mode control apparatus for enabling said processing unit to test said predetermined type of cache unit without causing said mode control apparatus to automatically degrade said operation of any of the levels using a series of standard tests designed for testing the operation of other types of cache units.

15. The test mode apparatus of claim 14 wherein said processing unit prior to using said series of standard tests is operative upon having received said predetermined response to apply cache commands to said cache unit for verifying that said mode control apparatus operates properly.

16. The apparatus of claim 14 wherein said enable/disable check mode control means includes:
- mode bistable means having an input and an output coupled to said mode control apparatus; and,
- input gating means coupled to said processing unit and to said bistable means, said input gating means being operative in response to said first field having said first value to switch said mode bistable means to said first state for disabling said mode control apparatus means and said input gating means being operative in response to said first field having a second value to switch said mode bistable means to a second state for enabling said mode control apparatus.

17. The test mode apparatus of claim 14 wherein said device response means includes:
- input decode gating means coupled to said processing unit for receiving said function code; and,
- first and second bistable means coupled to said input decode gating means and to said processing unit, said gating means being operative upon receipt of said function code having said predetermined value to switch said first bistable means to a first state for generating said predetermined response and said decode gating means being operative upon receipt of said function code having other than said predetermined value to switch said second bistable means to said first state generating another response for indicating that a different type of cache unit is being tested using said standard tests.

18. The apparatus of claim 17 wherein said processing unit includes means for receiving said responses during normal operation for determining said status, said predetermined type of response during said testing corresponds to a negative acknowledgement signal for identifying said predetermined type of cache unit and said another response corresponds to a positive acknowledgement signal indicating that said different type of cache is being tested.

19. The apparatus of claim 17 wherein said cache unit includes cache data and directory address stores, each organized into the same number of levels of storage locations and wherein said mode control apparatus includes error detection means coupled to said directory store for detecting errors occurring during the process of accessing data stored in said cache locations and degradation mode control circuits including a number of bistable elements, each bistable element being coupled to said error detection means for controlling the access of a predetermined number of levels, said each bistable means being switched to a first state for automatically degrading said operation of said cache unit when said error detection means detects an error in an address accessed from one of said predetermined number of levels of directory store associated therewith; and,
- first indicator means coupled to each of said number of bistable elements and to said processing unit, said indicator means being operative when said number of bistable elements are in said first state to generate an output signal to said processing unit for signalling an uncorrectable error, said check mode control means when in said second state inhibiting said number of bistable means from being switched to said first state preventing the generation of said output signal.

20. The apparatus of claim 19 wherein said error detection means includes:
- error storage means coupled to said degradation mode control circuits and to said enable/disable check mode control means, said error storage means being operative when said check mode control means switches to a second state during each cache read cycle of operation to switch to a predetermined state indicating that said error in said address is valid, said storage means when in said predetermined state conditioning different ones of said bistable elements of said degradaton mode control circuits to automatically degrade said operation of said cache unit and said error storage means being inhibited by said check mode control means when in said first state from switching to said predetermined state preventing said different ones of said bistable elements of said degradation mode control circuits from automatically degrading said operation of said cache unit and signalling said uncorrectable error.

21. The apparatus of claim 20 wherein said cache unit further includes second indicator means coupled to said error storage means and to said processing unit, said second indicator means being conditioned by said error storage means upon detecting the occurrence of a first error in accessing one of said directory store addresses, to switch to a first state for signalling a correctable error to said processing unit, said check mode control means when in said second state inhibiting said second indicator means from switching to said first state preventing signalling of said correctable error.

22. The test apparatus of claim 14 wherein said cache command code further includes other fields for initializing said cache levels to known states, said, cache unit being coupled to a main store, said store having a number of locations for storing sequences of instructions of said standard tests, said processing unit being operative prior to executing said plurality of standard tests during a first pass operation to apply a cache command having said first field specify a disabling type of operation and said other fields specifying a cache normal mode of operation wherein said cache unit is initialized with all levels active, said enable/disable check mode control means being conditioned by said first field to switch to said first state inhibiting the operation of said mode control apparatus for testing said cache unit while being operated in said normal mode with said standard tests.

23. The apparatus of claim 22 wherein said processing unit prior to executing said plurality of standard tests during second and third pass operations applies successive cache commands each having said first field specify said disabling type of operation and said other fields specify first and second cache degraded modes of operation respectively wherein said cache unit is initalized and said mode control apparatus places different combinations of said levels in active states, said enable/disable check mode control means being conditioned by each of said first fields to switch to said first state inhibiting the operation of said mode control apparatus for testing said cache unit while being operated in said second and third degraded modes with said standard tests.

24. The apparatus of claim 23 wherein said processing unit prior to executing said plurality of standard tests during a fourth pass operation applies cache test commands having said first field specify the enabling type of operation and said other fields specify said cache normal mode of operation, said enable/disable check mode control means being conditioned by said first field to switch to said second state enabling the operation of said mode control apparatus for testing said cache unit while being operated in said normal mode with said standard tests.

25. The apparatus of claim 22 wherein said processing unit completing said plurality of standard tests applies a further cache command having said first field specifying an enabling type of operation, said enable/disable check mode control means being conditioned by said first field to switch to a second state for enabling said mode control apparatus to automatically alter said number of levels of said cache unit in response to errors.

26. A method of testing the operation of a multilevel cache unit using test mode apparatus coupled to a processing unit, said cache unit including mode control apparatus for altering the number of cache levels, said method comprising the steps of:

generating a first cache command including a function code for defining the type of cache unit being tested and a command code including a first field coded to specify a type of enabling/disabling operation to be performed by said test mode apparatus;

said test mode apparatus generating a predetermined response to said processing unit signalling that said cache unit is a predetermined type of cache unit;

generating a further cache command to said test mode apparatus when said processing unit has received said predetermined response, said first field having a first predetermined value specifying a disabling operation; and, switching said test mode apparatus to a first state for inhibiting mode control apparatus from altering said number of cache levels and enabling said predetermined unit to be tested using a series of standard tests.

27. The method of claim 26 wherein said method further includes the steps of:

generating a cache command prior to executing a first pass through said standard tests having said first field set to said first predetermined value for specifying said disabling operation and other fields for specifying a cache normal mode of operation wherein said cache unit is initialized with all levels active; and, generating prior to executing second and third passes through said standard tests successive cache commands having said first field set to said first predetermined value and said other fields specifying first and second degraded modes of operation wherein said cache unit is initialized and different combinations of said number of levels are set to active states.

28. The method of claim 26 wherein said method further includes the steps of:

generating a cache command upon completing said series of standard test, said command having said first field set to a second predetermined value for specifying an enabling operation; and, switching said test mode apparatus to a second state for enabling said mode control apparatus to alter said cache levels.

* * * * *